(12) United States Patent
Kim et al.

(10) Patent No.: US 10,126,831 B2
(45) Date of Patent: Nov. 13, 2018

(54) COMPACT LIGHT EMITTING DIODE CHIP, LIGHT EMITTING DEVICE AND ELECTRONIC DEVICE INCLUDING THE SAME

(71) Applicant: SEOUL VIOSYS CO., LTD., Ansan-si (KR)

(72) Inventors: Ye Seul Kim, Ansan-si (KR); Kyoung Wan Kim, Ansan-si (KR); Sang Won Woo, Ansan-si (KR); Ji Hye Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 231 days.

(21) Appl. No.: 15/279,549

(22) Filed: Sep. 29, 2016

(65) Prior Publication Data

US 2017/0108937 A1  Apr. 20, 2017

(30) Foreign Application Priority Data

Oct. 16, 2015  (KR) .................... 10-2015-0144997
Dec. 17, 2015  (KR) .................... 10-2015-0181128

(51) Int. Cl.
*G06F 3/02* (2006.01)
*H01H 13/83* (2006.01)
(Continued)

(52) U.S. Cl.
CPC ........... *G06F 3/0202* (2013.01); *H01H 13/83* (2013.01); *H01L 33/382* (2013.01);
(Continued)

(58) Field of Classification Search
CPC ......... F21K 9/232; H01L 33/62; H01L 33/32; H01L 25/0753; H01L 33/0033;
(Continued)

(56) References Cited

U.S. PATENT DOCUMENTS 9,121,555 B2   9/2015  Hwang et al.
9,618,181 B2 *  4/2017  Hwang .................... F21V 5/04
(Continued)

FOREIGN PATENT DOCUMENTS

JP         2870210      3/1999
JP       2001-244500    9/2001
(Continued)

OTHER PUBLICATIONS

Non-Final Office Action dated March 8, 2018, issued in U.S. Appl. No. 15/852,704.
(Continued)

*Primary Examiner* — Tracie Y Green
(74) *Attorney, Agent, or Firm* — H.C. Park & Associates, PLC

(57) ABSTRACT

A light emitting diode chip used in devices includes: a substrate including protrusions disposed on an upper surface; a light emitting structure disposed on the substrate and including at least one hole through a second conductive type semiconductor layer and an active layer and partially exposing a first conductive type semiconductor layer; a contact electrode including an optically transparent conductive oxide; a light reflective insulation layer including a distributed Bragg reflector; a first pad electrode electrically connected to the first conductive type semiconductor layer; and a second pad electrode electrically connected to the contact electrode, wherein a portion of an upper surface of the substrate is exposed around the light emitting structure, the light reflective insulation layer adjoins the exposed portion of the upper surface of the substrate around the light emitting structure, and an upper edge of the substrate is spaced from the light reflective insulation layer.

44 Claims, 21 Drawing Sheets

(51) Int. Cl.
*H01L 33/38* (2010.01)
*H01L 33/46* (2010.01)

(52) U.S. Cl.
CPC ........ *H01H 2219/036* (2013.01); *H01L 33/38* (2013.01); *H01L 33/46* (2013.01)

(58) Field of Classification Search
CPC ....... H01L 33/06; H01L 33/382; H01L 33/46; H01L 33/42; H01L 2224/73204; H05K 1/189; H05K 2201/10106; G06F 1/1662; F21Y 2107/70
See application file for complete search history.

(56) References Cited

U.S. PATENT DOCUMENTS

| | | |
|---|---|---|
| 2005/0056855 A1 | 3/2005 | Lin et al. |
| 2010/0117111 A1 | 5/2010 | Illek et al. |
| 2013/0146916 A1 | 6/2013 | Yamamoto et al. |
| 2013/0161585 A1 | 6/2013 | Na et al. |
| 2015/0108528 A1* | 4/2015 | Chae ................. H01L 33/62 257/98 |
| 2016/0156157 A1 | 6/2016 | Matsubara et al. |
| 2017/0194531 A1 | 7/2017 | Huang et al. |
| 2017/0200858 A1* | 7/2017 | Chae ................. H01L 33/62 |
| 2018/0135809 A1* | 5/2018 | Kim ................. H01L 33/32 |

FOREIGN PATENT DOCUMENTS

| | | |
|---|---|---|
| JP | 2006-245062 | 9/2006 |
| JP | 2009-164423 | 7/2009 |
| JP | 4507358 | 7/2010 |
| KR | 10-2005-0027910 | 3/2005 |
| KR | 10-2006-0129526 | 12/2006 |
| KR | 10-2011-0098874 | 7/2009 |
| KR | 10-2010-0016631 | 2/2010 |
| KR | 10-2012-0086875 | 8/2012 |
| KR | 10-1219290 | 1/2013 |
| KR | 10-2013-0074471 | 7/2013 |
| KR | 10-2014-0060474 | 5/2014 |
| KR | 10-2014-0073160 | 6/2014 |
| KR | 10-2014-0083357 | 7/2014 |
| KR | 10-2014-0085195 | 7/2014 |
| TW | 201351701 | 12/2013 |
| TW | 201515351 | 4/2015 |
| TW | M542252 | 5/2017 |

OTHER PUBLICATIONS

Korean Office Action dated Jul. 27, 2017, in Korean Patent Application No. 10-2015-0144997 (with English Translation).
International Search Report dated Jan. 9, 2017 in International Application No. PCT/KR2016/011528.
Notice of Allowance dated Sep. 22, 2017 in U.S. Appl. No. 15/348,192.
Notification of Reason for Refusal dated Sep. 27, 2017, issued in Korean Patent Application No. 10-2015-0181128.
Notice of Allowance dated Jun. 22, 2018, issued in U.S. Appl. No. 15/852,704.

* cited by examiner

COMPACT LIGHT EMITTING DIODE CHIP, LIGHT EMITTING DEVICE AND ELECTRONIC DEVICE INCLUDING THE SAME

CROSS-REFERENCE TO RELATED APPLICATIONS

This application claims priority from and the benefit of Korean Patent Application No. 10-2015-0144997, filed on Oct. 16, 2015, and Korean Patent Application No. 10-2015-0181128, filed on Dec. 17, 2015, which are hereby incorporated by reference for all purposes as if fully set forth herein.

BACKGROUND

Field

Exemplary embodiments of the present disclosure relate to a compact light emitting diode chip, and a light emitting device and an electronic device including the same, and more particularly, a compact light emitting diode chip having a small area and a slim thickness, and a light emitting device and an electronic device including the same.

Discussion of the Background

Recently, with increasing use of portable devices such as mobile phones, tablet PCs, and notebook computers, there has been increasing demand for portable devices with improved portability. Therefore, there is a need for development of portable devices that are thin and have a small size. Such a portable device requires various kinds of displays and light emitting devices, particularly, a compact light emitting device, in order to realize compactness and slimness of the portable device.

Since a light emitting diode may be used as a light emitting device for portable devices, there is a need for development of a light emitting diode chip and a light emitting device, which have a small volume so as to provide a suitable structure for slim and/or compact portable electronic devices while securing high luminous efficacy and high production yields.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present disclosure provide a light emitting diode chip configured to have a minimized area and thickness while securing high luminous efficacy and high production yields.

Additional aspects will be set forth in the detailed description which follows, and, in part, will be apparent from the disclosure, or may be learned by practice of the inventive concept.

Exemplary embodiments of the present disclosure provide a light emitting device that includes a compact and slim light emitting diode chip mounted on a substrate via a bonding layer having a minimum thickness, thereby realizing a slim structure while securing good durability.

Exemplary embodiments of the present disclosure provide an electronic device that includes a compact and slim light emitting diode chip and/or a light emitting device including the same.

In accordance with one aspect of the present disclosure, a light emitting diode chip includes: a substrate including protrusions disposed on an upper surface thereof; a light emitting structure disposed on the substrate and including a first conductive type semiconductor layer, a second conductive type semiconductor layer disposed on the first conductive type semiconductor layer, and an active layer disposed between the first and second conductive type semiconductor layers, the light emitting structure having at least one hole through the second conductive type semiconductor layer and the active layer and exposing a portion of the first conductive type semiconductor layer; a contact electrode disposed on at least part of the second conductive type semiconductor layer and in ohmic contact with the second conductive type semiconductor layer and including an optically transparent conductive oxide; a light reflective insulation layer covering a side surface and an upper surface of the light emitting structure, and including a first opening exposing the first conductive type semiconductor layer exposed through the hole and a second opening partially exposing the contact electrode, the light reflective insulation layer including a distributed Bragg reflector (DBR); a first pad electrode disposed on the light reflective insulation layer and electrically connected to the first conductive type semiconductor layer through the first opening; and a second pad electrode disposed on the light reflective insulation layer and electrically connected to the contact electrode through the second opening, wherein a portion of an upper surface of the substrate is exposed around the light emitting structure, the light reflective insulation layer adjoins the upper surface of the substrate exposed through the light emitting structure, and an upper edge of the substrate is spaced apart from the light reflective insulation layer.

In accordance with another aspect of the present disclosure, a light emitting diode chip includes: a substrate including protrusions disposed on an upper surface thereof and having a partially exposed portion on the upper surface thereof; a light emitting structure disposed on the substrate, and including a first conductive type semiconductor layer, a second conductive type semiconductor layer disposed on the first conductive type semiconductor layer, and an active layer disposed between the first and second conductive type semiconductor layers, the light emitting structure including a mesa including the active layer and the second conductive type semiconductor layer; a contact electrode disposed on the mesa and including an optically transparent conductive oxide; an insulation layer covering a side surface and an upper surface of the light emitting structure and the upper surface of the substrate, and including a first opening partially exposing the first conductive type semiconductor layer and a second opening partially exposing the contact electrode; and a first pad electrode and a second pad electrode disposed on the insulation layer, wherein the mesa includes a first portion and a second portion, the first portion includes grooves disposed on side surfaces of the mesa, the grooves being disposed on at least three side surfaces of the first portion, the first opening exposes at least part of the first conductive type semiconductor layer exposed through the grooves, the first pad electrode is disposed on the first portion and covers at least part of side surfaces of the grooves in ohmic contact with the first conductive type semiconductor layer through the first opening, and the second pad electrode is disposed on the second portion and electrically connected to the contact electrode through the second opening.

In accordance with a further aspect of the present disclosure, a light emitting device includes: a second substrate; a light emitting diode chip disposed on the second substrate; and a first substrate including a first bonding portion and a second bonding portion disposed between the light emitting diode chip and the second substrate, wherein the light emitting diode chip includes: a first substrate including protrusions disposed on a lower surface thereof; a light emitting structure disposed under the first substrate, and including a second conductive type semiconductor layer, a first conductive type semiconductor layer disposed above the second conductive type semiconductor layer and an active layer disposed between the first and second conductive type semiconductor layers, the light emitting structure including at least one hole through the second conductive type semiconductor layer and the active layer and partially exposing the first conductive type semiconductor layer; a contact electrode at least partially disposed under the second conductive type semiconductor layer and in ohmic contact with the second conductive type semiconductor layer; a light reflective insulation layer covering a side surface and a lower surface of the light emitting structure, and including a first opening exposing the first conductive type semiconductor layer exposed through the hole and a second opening partially exposing the contact electrode, the light reflective insulation layer including a distributed Bragg reflector; a first pad electrode disposed under the light reflective insulation layer and electrically connected to the first conductive type semiconductor layer through the first opening; and a second pad electrode disposed under the light reflective insulation layer and electrically connected to the contact electrode through the second opening, wherein a portion of the lower surface of the first substrate is exposed around the light emitting structure, the light reflective insulation layer adjoins the portion of the lower surface of the first substrate exposed around the light emitting structure, a lower edge of the first substrate is spaced apart from the light reflective insulation layer, and the first and second bonding portions are electrically connected to the first and second pad electrodes, respectively.

In accordance with yet another aspect of the present disclosure, an electronic apparatus including an input device further includes at least one of light emitting diode chips and light emitting devices according to various exemplary embodiments.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
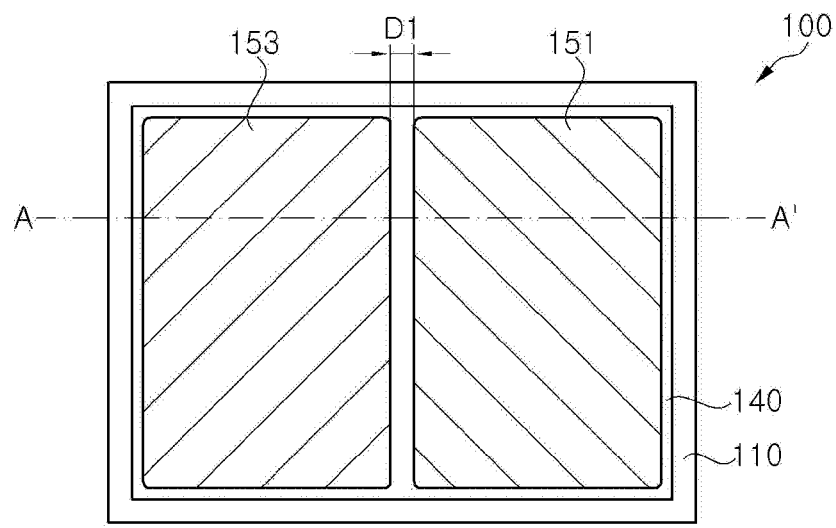
FIG. 1, FIG. 2, and FIG. 3 are plan views and a cross-sectional view of a light emitting diode chip according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A light emitting diode chip, a light emitting device, and an electronic apparatus according to exemplary embodiments of the present disclosure may be realized in various ways.

According to various exemplary embodiments, a light emitting diode chip includes: a substrate including protrusions disposed on an upper surface thereof; a light emitting structure disposed on the substrate and including a first conductive type semiconductor layer, a second conductive type semiconductor layer disposed on the first conductive type semiconductor layer, and an active layer disposed between the first and second conductive type semiconductor layers, the light emitting structure having at least one hole through the second conductive type semiconductor layer and the active layer and exposing a portion of the first conductive type semiconductor layer; a contact electrode disposed on at least part of the second conductive type semiconductor layer, in ohmic contact with the second conductive type semiconductor layer, and including an optically transparent conductive oxide; a light reflective insulation layer covering a side surface and an upper surface of the light emitting structure, and including a first opening exposing the first conductive type semiconductor layer exposed through the hole and a second opening partially exposing the contact electrode, the light reflective insulation layer including a distributed Bragg reflector; a first pad electrode disposed on the light reflective insulation layer and electrically connected to the first conductive type semiconductor layer through the first opening; and a second pad electrode disposed on the light reflective insulation layer and electrically connected to the contact electrode through the second opening, wherein a portion of an upper surface of the substrate is exposed around the light emitting structure, the light reflective insulation layer adjoins the upper surface of the substrate exposed through the light emitting structure, and an upper edge of the substrate is spaced apart from the light reflective insulation layer.

The light emitting diode chip may have a thickness of 40 μm to 90 μm.

The light emitting diode chip may have a horizontal cross-sectional area of 30,000 μm$^2$ to 65,000 μm$^2$.

Drive current for operation of the light emitting diode chip may be configured to have a current density of 7 mA/mm$^2$ to 250 mA/mm$^2$.

A total area of the first pad electrode and the second pad electrode may range from 80% to 95% of a horizontal cross-sectional area of the light emitting diode chip.

A shortest distance between the first pad electrode and the second pad electrode may range from 3 μm to 20 μm.

Some of the protrusions disposed on the upper surface of the substrate may be covered by the light reflective insulation layer.

The other protrusions disposed on the upper surface of the substrate may be exposed.

The contact electrode may cover an upper surface of the second conductive type semiconductor layer, and may include a third opening exposing the hole of the light emitting structure and at least one fourth opening partially exposing the second conductive type semiconductor layer.

The fourth opening may have a smaller width than the second opening and an upper surface of the contact electrode may partially adjoin the second pad electrode.

The substrate may include a patterned sapphire substrate.

The first pad electrode may include a depression on an upper surface thereof and disposed at a location corresponding to the first opening, and the second pad electrode may include a depression on an upper surface thereof and disposed at a location corresponding to the second opening.

According to various exemplary embodiments of the present disclosure, a light emitting device includes: a second substrate; a light emitting diode chip disposed on the second substrate; and a first substrate including a first bonding portion and a second bonding portion disposed between the light emitting diode chip and the second substrate, wherein the light emitting diode chip includes: a first substrate including protrusions disposed on a lower surface thereof; a light emitting structure disposed under the first substrate, and including a second conductive type semiconductor layer, a first conductive type semiconductor layer disposed above the second conductive type semiconductor layer and an active layer disposed between the first and second conductive type semiconductor layers, the light emitting structure including at least one hole through the second conductive type semiconductor layer and the active layer and partially exposing the first conductive type semiconductor layer; a contact electrode at least partially disposed under the second conductive type semiconductor layer and in ohmic contact with the second conductive type semiconductor layer; a light reflective insulation layer covering a side surface and a lower surface of the light emitting structure, and including a first opening exposing the first conductive type semiconductor layer exposed through the hole and a second opening partially exposing the contact electrode, the light reflective insulation layer including a distributed Bragg reflector; a first pad electrode disposed under the light reflective insulation layer and electrically connected to the first conductive type semiconductor layer through the first opening; and a second pad electrode disposed under the light reflective insulation layer and electrically connected to the contact electrode through the second opening, wherein a portion of the lower surface of the first substrate is exposed around the light emitting structure, the light reflective insulation layer adjoins the portion of the lower surface of the first substrate exposed around the light emitting structure, a lower edge of the first substrate is spaced apart from the light reflective insulation layer, and the first and second bonding portions are electrically connected to the first and second pad electrodes, respectively.

A shortest distance between the first and second bonding portions may be greater than a shortest distance between the first and second pad electrodes.

At least one of the first and second bonding portions may at least partially cover the light reflective insulation layer covering the side surface of the light emitting structure.

At least one of the first and second bonding portions may at least partially cover the lower surface of the first substrate exposed around the light emitting structure.

At least one of the first and second bonding portions may at least partially cover a side surface of the first substrate.

The first and second bonding portions may include solder.

According to various exemplary embodiments of the present disclosure, an electronic apparatus including an input device further includes at least one of light emitting diode chips and light emitting devices according to exemplary embodiments of the present disclosure.

The input device may include a keyboard with a plurality of keys. The plurality of keys may include a luminous region disposed on upper surfaces thereof and light discharged through the luminous region may be emitted from the light emitting diode chip or the light emitting device.

The input device may include a keyboard with a plurality of keys. The plurality of keys may include a luminous region disposed on upper surfaces thereof, the light emitting diode chip may be disposed under at least some of the plurality of keys, and light emitted from the light emitting diode chip or the light emitting device may be discharged through the luminous region.

According to various exemplary embodiments of the present disclosure, a light emitting diode chip includes: a substrate including protrusions disposed on an upper surface thereof and having a partially exposed portion on the upper surface thereof; a light emitting structure disposed on the substrate, and including a first conductive type semiconductor layer, a second conductive type semiconductor layer disposed on the first conductive type semiconductor layer, and an active layer disposed between the first and second conductive type semiconductor layers, the light emitting structure including a mesa including the active layer and the second conductive type semiconductor layer; a contact electrode disposed on the mesa and including an optically transparent conductive oxide; an insulation layer covering a side surface and an upper surface of the light emitting structure and the upper surface of the substrate, and including a first opening partially exposing the first conductive type semiconductor layer and a second opening partially exposing the contact electrode; and a first pad electrode and a second pad electrode disposed on the insulation layer, wherein the mesa includes a first portion and a second portion, the first portion includes grooves disposed on side surfaces of the mesa, the grooves being disposed on at least three side surfaces of the first portion, the first opening exposes at least part of the first conductive type semiconductor layer exposed through the grooves, the first pad electrode is disposed on the first portion and covers at least part of side surfaces of the grooves in ohmic contact with the first conductive type semiconductor layer through the first opening, and the second pad electrode is disposed on the second portion and electrically connected to the contact electrode through the second opening.

The first contact region may include a plurality of first contact regions in which at least part of the first conductive type semiconductor layer exposed through the plurality of grooves contacts the first pad electrode; and a second contact region in which the contact electrode contacts the second pad electrode, and a shortest distance from a first contact region disposed farthest away from the second contact region to the second contact region may be 200 µm or less.

The mesa may include a first side surface, a second side surface disposed opposite the first side surface, and third and fourth side surfaces disposed between the first side surface and the second side surface, each of the first portion and the second portion of the mesa may include a first side surface and a second side surface, at least one of the plurality of grooves may be disposed on the first side surface, and at least some of the plurality of grooves may be disposed on the third side surface and the fourth side surface.

The plurality of grooves may be arranged in symmetry with respect to an imaginary extending from the first side surface to the second side surface.

Some side surfaces of the first opening may be separated from the first pad electrode.

At least one of the grooves may be disposed closer to the second pad electrode than the side surface of the first pad electrode opposite the second pad electrode.

The contact electrode may include a third opening, which may be disposed inside the second opening.

In the contact electrode, a region between the third opening and a side surface of the second opening may adjoin the second pad electrode.

The substrate may include a modification region disposed on at least part of a side surface thereof and a distance from the modification region to the upper surface of the substrate may be smaller than a distance from the modification region to a lower surface of the substrate.

The distance from the modification region to the upper surface of the substrate may range from 30 µm to 35 µm.

The light emitting diode chip may have a thickness of 40 µm to 90 µm.

The light emitting diode chip may have a horizontal cross-sectional area of 30,000 µm$^2$ to 70,000 µm$^2$.

Drive current for operation of the light emitting diode chip may be configured to have a current density of 5 mA/mm² to 400 mA/mm².

A total area of the first pad electrode and the second pad electrode may be 50% to 95% of a horizontal cross-sectional area of the light emitting diode chip.

According to various exemplary embodiments, a light emitting device includes: a second substrate; a light emitting diode chip disposed on the second substrate; and a first bonding portion and a second bonding portion disposed between the light emitting diode chip and the second substrate, wherein the light emitting diode chip is the light emitting diode chip according to one of the embodiments disclosed herein, and the first bonding portion and the second bonding portion may adjoin the first pad electrode and the second pad electrode of the light emitting diode chip, respectively.

A shortest distance between the first and second bonding portions may be greater than the shortest distance between the first and second pad electrodes.

At least one of the first and second bonding portions may at least partially cover the light reflective insulation layer covering the side surface of the light emitting structure.

At least one of the first and second bonding portions may at least partially cover a lower surface of the first substrate around the light emitting structure.

At least one of the first and second bonding portions may at least partially cover a side surface of the first substrate.

The first and second bonding portions may include solder.

According to various exemplary embodiments of the present disclosure, an electronic apparatus may include an input device and one of light emitting diode chips or light emitting devices according to exemplary embodiments of the present disclosure.

The input device may include a keyboard with a plurality of keys, and each of the plurality of keys may include a luminous region disposed on an upper surface thereof, and light discharged through the luminous region may be emitted from the light emitting diode chip or the light emitting device.

The input device may include a keyboard with a plurality of keys, each of the plurality of keys may include a luminous region disposed on an upper surface thereof, the light emitting diode chip or the light emitting device may be disposed under at least some of the plurality of keys, and light emitted from the light emitting diode chip or the light emitting device may be discharged through the luminous region.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2:
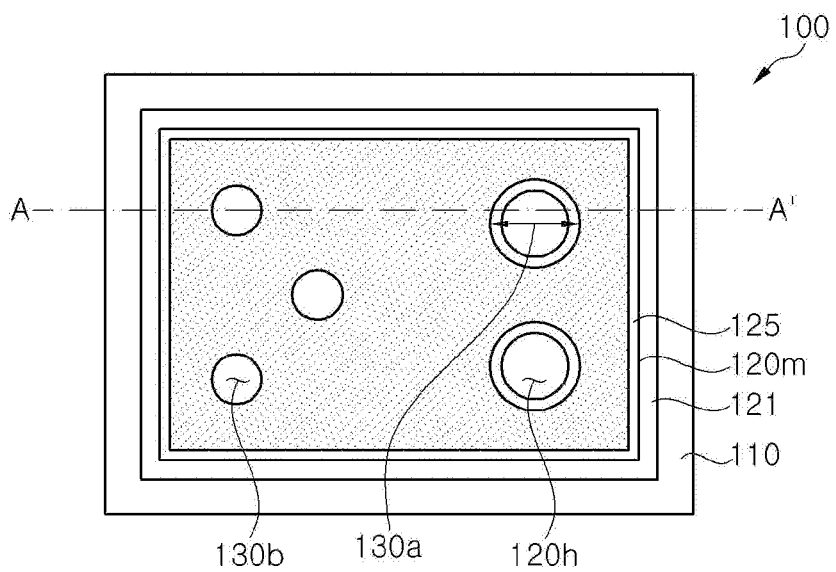
Figure 3:
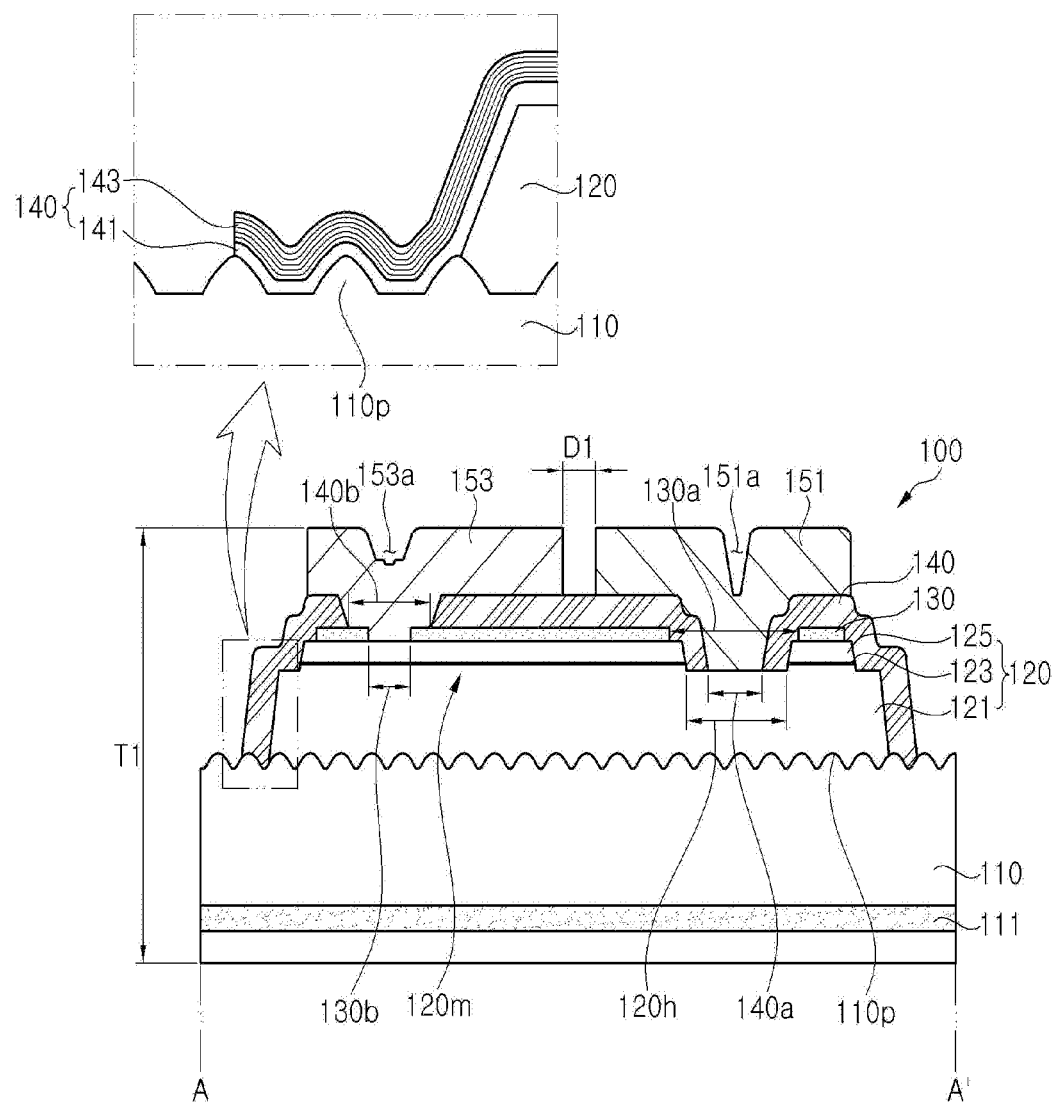

FIG. 1 to FIG. 3 are plan views and a cross-sectional view of a light emitting diode chip according to one exemplary embodiment of the present disclosure. Specifically, FIG. 1 is a plan view of a light emitting diode chip 100 and FIG. 2 is a plan view of a mesa 120m and a contact electrode 130, in which first and second pad electrodes 151, 153 and a light reflective insulation layer 140 are omitted for convenience of description. FIG. 3 is a cross-sectional view taken along line A-A' of FIG. 1 and FIG. 2.

Referring to FIG. 1 to FIG. 3, the light emitting diode chip 100 includes a substrate 110, a light emitting structure 120, a contact electrode 130, a light reflective insulation layer 140, a first pad electrode 151, and a second pad electrode 153.

The light emitting diode chip 100 may be a compact light emitting diode chip having a relatively small horizontal area. The light emitting diode chip 100 may have a horizontal cross-sectional area of about 65,000 μm² or less, specifically about 30,000 μm² to about 65,000 μm². For example, the light emitting diode chip 100 may have a size of 230 μm×180 μm or 250 μm×200 μm. It should be understood that the size of the light emitting diode chip 100 according to exemplary embodiments is not limited thereto. In some exemplary embodiments, the light emitting diode chip 100 may be a compact light emitting diode chip having a relatively slim thickness. The light emitting diode chip 100 may have a thickness T1 of about 90 μm or less, specifically a thickness T1 of about 40 μm to 90 μm. Drive current for operation of the light emitting diode chip 100 may have a current density of 7 mA/mm² to 250 mA/mm². With the horizontal cross-sectional area and thickness as described above, the light emitting diode chip 100 according to the exemplary embodiments can be easily applied to various electronic apparatuses that require compact and/or slim light emitting devices.

The substrate 110 may be an insulating or conductive substrate. The substrate 110 may be a growth substrate for growth of the light emitting structure 120, and may include a sapphire substrate, a silicon carbide (SiC) substrate, a silicon (Si) substrate, a gallium nitride (GaN) substrate, an aluminum nitride (AlN) substrate, and the like. The substrate 110 may include a plurality of protrusions 110p disposed on some region of an upper surface thereof. On the substrate 110, the plurality of protrusions 110p may be disposed in a regular and/or irregular pattern. For example, the substrate 110 may include a patterned sapphire substrate (PSS) having a plurality of protrusions 110p disposed on an upper surface thereof.

Furthermore, the substrate 110 may include at least one modification region 111 having a band shape and extending from at least one side surface of the substrate 110 in the horizontal direction. The modification region 111 may be disposed during division of the substrate 110 for diode isolation. For example, the modification region 111 may be formed through internal machining of the substrate 110 using internal machining equipment (for example, a stealth dicing machine). A scribing plane may be formed inside the substrate 110 using an internal machining laser. In this exemplary embodiment, a distance from the modification region 111 to a lower surface of the substrate 110 may be smaller than a distance from the modification region 111 to an upper surface of the substrate 110. In consideration of light emitted through a side surface of the light emitting diode chip 100, laser machining is performed relatively near the lower surface of the substrate 110 such that the modification region 111 is disposed relatively near the lower surface of the substrate 110, thereby improving extraction of light from the light emitting structure 120. Further, the structure wherein the modification region 111 is disposed near the light emitting structure 120 can have problems with electrical characteristics due to damage to the nitride-based semiconductors upon laser machining. Accordingly, with the structure wherein the modification region 111 is disposed near the lower surface of the substrate 110, it is possible to prevent deterioration in reliability and luminous efficacy of the light emitting diode chip 100 due to damage to the light emitting structure 120.

The light emitting structure 120 is disposed on the substrate 110. A lower surface of the light emitting structure 120 may have a smaller area than the upper surface of the substrate 110, whereby the upper surface of the substrate 110 can be exposed in at least some region around the light emitting structure 120. Some of the plurality of protrusions 110p may be disposed between the light emitting structure 120 and the substrate 110, and the other protrusions 110p may be exposed around the light emitting structure 120.

With the structure wherein the upper surface of the substrate 110 is partially exposed around the light emitting structure 120, the light emitting diode chip 100 can prevent damage to the light emitting structure 120 by suppressing wafer bowing during fabrication thereof, thereby improving production yield. In addition, the light emitting diode chip can reduce stress applied to the light emitting structure 120 by suppressing wafer bowing, thereby allowing the substrate 110 to be machined to a slimmer thickness. As a result, the light emitting diode chip 100 can have a slim structure having a thickness of about 90 μm or less. This structure will be described in more detail in the following exemplary embodiments.

The light emitting structure 120 includes a first conductive type semiconductor layer 121, a second conductive type semiconductor layer 125 disposed on the first conductive type semiconductor layer 121, and an active layer 123 interposed between the first conductive type semiconductor layer 121 and the second conductive type semiconductor layer 125. The first conductive type semiconductor layer 121, the active layer 123 and the second conductive type semiconductor layer 125 may include a III-V nitride-based semiconductor, for example, a nitride-based semiconductor such as (Al, Ga, In)N. The first conductive type semiconductor layer 121 may include an n-type dopant (for example, Si, Ge, Sn) and the second conductive type semiconductor layer 125 may include a p-type dopant (for example, Mg, Sr, Ba), or vice versa. The active layer 123 may include a multi-quantum well (MQW) structure and the composition ratio of the nitride-based semiconductors may be adjusted to emit light having a desired wavelength. Particularly, in this exemplary embodiment, the second conductive type semiconductor layer 125 may be a p-type semiconductor layer.

The light emitting structure 120 may include at least one hole 120h through the active layer 123 and the second conductive type semiconductor layer 125 and at least partially exposing the first conductive type semiconductor layer 121. The hole 120h exposes at least part of the first conductive type semiconductor layer 121 and a side surface of the hole 120h may be surrounded by the active layer 123 and the second conductive type semiconductor layer 125. In addition, the light emitting structure 120 may include a mesa 120m that includes the active layer 123 and the second conductive type semiconductor layer 125. The mesa 120m is disposed on the first conductive type semiconductor layer 121. The hole 120h may be formed through the mesa 120m so as to be surrounded by the mesa 120m. It should be understood that the light emitting diode chip 100 according to this exemplary embodiment may have any structure wherein the first conductive type semiconductor layer 121 is exposed through the hole 120h, and can omit the mesa 120m.

The contact electrode 130 is disposed on the second conductive type semiconductor layer 125. The contact electrode 130 may be in ohmic contact with the second conductive type semiconductor layer 125. The contact electrode 130 may include a transparent electrode. The transparent electrode may include at least one of, for example, optically transparent conductive oxides such as indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), and optically transparent metals such as Ni/Au. The conductive oxides may further include various dopants.

Particularly, the contact electrode 130 including the optically transparent conductive oxide has high efficiency in formation of an ohmic contact with the second conductive type semiconductor layer 125. That is, since contact resistance between a conductive oxide such as ITO or ZnO and the second conductive type semiconductor layer 125 is lower than contact resistance between a metallic electrode and the second conductive type semiconductor layer 125, the contact electrode 130 including the conductive oxide can reduce forward voltage $V_f$ of the light emitting diode chip 100, thereby improving luminous efficacy. Particularly, in a compact light emitting diode chip driven by relatively low current density like the light emitting diode chip 100 according to this exemplary embodiment, the contact resistance between the contact electrode 130 and the second conductive type semiconductor layer 125 is reduced so as to improve ohmic contact characteristics, thereby more effectively improving luminous efficacy. Further, since the conductive oxide has a lower probability of peeling off of the nitride-based semiconductor layer than the metallic electrode, the light emitting diode chip 100 having the contact electrode 130 including the conductive oxide has high reliability. On the other hand, although the conductive oxide has lower lateral current spreading efficiency than the metallic electrode, the light emitting diode chip 100 according to this exemplary embodiment has a horizontal cross-sectional area of about 65,000 μm or less and thus suffers from insignificant or no deterioration in luminous efficacy caused by deterioration in current spreading efficiency. In this way, the contact electrode 130 including the conductive oxide is applied to the light emitting diode chip 100, thereby improving electrical characteristics and luminous efficacy.

The contact electrode 130 may have a thickness of about 2,000 Å to 3,000 Å, without being limited thereto. For example, the contact electrode 130 including ITO may have a thickness of about 2,400 Å. Within this thickness range of the contact electrode 130, the light emitting diode chip 100 can exhibit improved electrical characteristics by efficiently spreading electric current in the lateral direction.

In addition, the contact electrode 130 includes a first opening 130a exposing the at least one hole 120h. The first opening 130a may be disposed such that a side surface of the first opening 130a is separated from the at least one hole 120h while being surrounded by the at least one hole 120h. In this exemplary embodiment, the first opening 130a may have a greater size than the hole 120h. The contact electrode 130 may be disposed to cover substantially the entirety of an upper surface of the second conductive type semiconductor layer 125, thereby improving current spreading efficiency upon operation of the light emitting diode chip 100. Furthermore, the contact electrode 130 may further include at least one second opening 130b that partially exposes the second conductive type semiconductor layer 125. A structure wherein the second pad electrode 153 described below is disposed to fill at least part of the second opening 130b can increase a contact area of the second pad electrode 153. With this structure, the light emitting diode chip can effectively prevent the second pad electrode 153 from peeling off of the contact electrode 130 or the light emitting structure 120. This structure will be described in more detail below.

The light reflective insulation layer 140 covers an upper surface and a side surface of the light emitting structure 120 and also covers the contact electrode 130. In addition, the light reflective insulation layer 140 may extend to the exposed portion of the upper surface of the substrate 110 around the light emitting structure 120. In this structure, the light reflective insulation layer 140 may adjoin the upper surface of the substrate 110 and thus can be more stably disposed while covering the side surface of the light emitting structure 120. Here, the light reflective insulation layer 140 does not extend to an upper edge of the substrate 110 such that the upper surface of the substrate 110 near the upper edge of the substrate 110 is exposed. Further, the light reflective insulation layer 140 may include a third opening 140a that partially exposes the first conductive type semiconductor layer 121 exposed through the at least one hole 120h, and a fourth opening 140b that partially exposes the contact electrode 130.

The third opening 140a of the light reflective insulation layer 140 partially exposes the first conductive type semiconductor layer 121 exposed through the at least one hole 120h. In this structure, the side surface of the hole 120h is covered by the light reflective insulation layer 140 so as to prevent short circuit. The third opening 140a may be used as a passage for electrical connection between the first conductive type semiconductor layer 121 and the first pad electrode 151. The fourth opening 140b of the light reflective insulation layer 140 partially exposes the contact electrode 130. The fourth opening 140b may be used as a passage for electrical connection between the contact electrode 130 and the second pad electrode 153. In some exemplary embodiments, the fourth opening 140b is positioned at a location corresponding to the second opening 130b of the contact electrode 130. The fourth opening 140b has a greater size than the second opening 130b such that an upper surface of the contact electrode 130 is partially exposed through the fourth opening 140b.

The light reflective insulation layer 140 may include a distributed Bragg reflector (DBR). The distributed Bragg reflector may be formed by repeatedly stacking dielectric layers having different indices of refraction and including, for example, $TiO_2$, $SiO_2$, $HfO_2$, $ZrO_2$, $Nb_2O_5$, $MgF_2$, and the like. In some exemplary embodiments, the light reflective insulation layer 140 may have an alternating structure of $TiO_2/SiO_2$ layers. The distributed Bragg reflector may be composed of 4 to 20 pairs of layers each having an optical thickness equal to one-quarter of a particular wavelength. An uppermost layer of the light reflective insulation layer 140 may be formed of $SiN_X$. The layer of $SiN_X$ has good moisture resistance to protect the light emitting diode chip from moisture.

In the structure wherein the light reflective insulation layer 140 includes the distributed Bragg reflector, a lowermost layer of the light reflective insulation layer 140 can act as a base layer or an interface layer capable of improving film quality of the distributed Bragg reflector. As shown in an enlarged view of FIG. 3, the light reflective insulation layer 140 may include an interface layer 141 having a relatively thick thickness and a stack structure 143 of dielectric layers stacked on the interface layer 141 and having different indices of refraction. For example, the light reflective insulation layer 140 may include an interface layer 141 having a thickness of about 0.2 µm to about 1.0 µm and formed of $SiO_2$ and a stack structure 143 in which $TiO_2/SiO_2$ layers are repeatedly stacked in a predetermined cycle on the interface layer 141.

The distributed Bragg reflector may have a relatively high reflectivity with respect to visible light. The distributed Bragg reflector may be configured to have a reflectivity of 90% or higher with respect to light having an angle of incidence of 0° to 60° at a wavelength of 400 nm to 700 nm. The distributed Bragg reflector having this reflectivity can be provided by controlling the kinds, thickness and stacking cycle of the dielectric layers constituting the distributed Bragg reflector. As a result, it is possible to form a distributed Bragg reflector having high reflectivity with respect to light having relatively long wavelengths (for example, 550 nm to 700 nm) and light having relatively short wavelengths (for example, 400 nm to 550 nm).

In this way, the distributed Bragg reflector may include a multilayer structure so as to have high reflectivity with respect to light in a broad wavelength band. That is, the distributed Bragg reflector may include a first stack structure in which dielectric layers having a first thickness are stacked one above another and a second stack structure in which dielectric layers having a second thickness are stacked one above another. For example, the distributed Bragg reflector may include a first stack structure in which dielectric layers having a smaller thickness than an optical thickness equal to one-quarter of a central wavelength (about 550 nm) of visible light are stacked one above another and a second stack structure in which dielectric layers having a greater thickness than the optical thickness equal to one-quarter of the central wavelength (about 550 nm) of visible light are stacked one above another. In some exemplary embodiments, the distributed Bragg reflector may further include a third stack structure in which a dielectric layer having a greater thickness than the optical thickness equal to one-quarter of the central wavelength (about 550 nm) of visible light and a dielectric layer having a smaller thickness than the optical thickness equal to one-quarter of the central wavelength (about 550 nm) of visible light are repeatedly stacked one above another.

The light reflective insulation layer 140 may partially cover the exposed portion of the upper surface of the substrate 110. In this exemplary embodiment, the light reflective insulation layer 140 may partially cover the protrusions 110p on the exposed portion of the upper surface of the substrate 110. As shown in the enlarged view of FIG. 3, the light reflective insulation layer 140 may cover some of the exposed protrusions 110p. A surface of the light reflective insulation layer 140 covering the upper surface of the substrate 110 may generally have a similar profile to that of the surface of the substrate 110. The light reflective insulation layer 140 is disposed to cover the exposed protrusions 110p of the substrate 110, thereby improving luminous efficacy of the light emitting diode chip 100 by reflecting light scattered by the exposed protrusions 110p.

Luminous efficacy of the light emitting diode chip 100 can be improved through reflection of light by the distributed Bragg reflector of the light reflective insulation layer 140 covering substantially the entirety of the upper surface and the side surface of the light emitting structure 120. Particularly, light having passed through the contact electrode 130, which includes the conductive oxide capable of improving electrical characteristics of the light emitting diode chip 100, can be discharged through the lower surface of the substrate 110 through reflection by the light reflective insulation layer 140. Further, since the light reflective insulation layer 140 also covers the side surface of the light emitting structure 120, light traveling towards the side surface of the light emitting structure 120 is also reflected by the light reflective insulation layer 140 to be discharged through the lower surface of the substrate 110. Furthermore, since the upper surface of the substrate 110 around the light emitting structure 120 is exposed, the light reflective insulation layer 140 adjoins the upper surface of the substrate 110 such that the side surface of the light emitting structure 120 can be more stably covered by the light reflective insulation layer 140, thereby minimizing light loss through the side surface of the light emitting structure 120.

In the structure wherein the light reflective insulation layer 140 adjoins the upper surface of the substrate 110, the upper surface of the substrate 110 near the upper edge thereof is exposed. That is, the upper edge of the substrate 110 is separated from the light reflective insulation layer 140. Accordingly, it is possible to prevent damage (for example, peeling, breakage, and the like) to the light reflective insulation layer 140 by a laser beam upon division of the substrate 110 (for example, through internal dicing, scribing and/or breaking) in the course of dividing a wafer to form a plurality of light emitting diode chips 100. Particularly, in the structure wherein the light reflective insulation layer 140 includes the distributed Bragg reflector, damage to the light reflective insulation layer 140 can cause deterioration in light reflectivity. According to this exemplary embodiment, it is possible to prevent deterioration in light reflectivity due to such damage to the light reflective insulation layer 140. This will be described in more detail below in the following exemplary embodiments.

The first pad electrode 151 and the second pad electrode 153 are disposed on the light reflective insulation layer 140. The first pad electrode 151 may be in ohmic contact with the first conductive type semiconductor layer 121 through the third opening 140a and the second pad electrode 153 may be electrically connected to the contact electrode 130 through the fourth opening 140b. In the structure wherein the contact electrode 130 includes the second opening 130b, the second pad electrode 153 may contact the second conductive type semiconductor layer 125. In this structure, however, since contact resistance between the second pad electrode 153 and the second conductive type semiconductor layer 125 is higher than contact resistance between the second pad electrode 153 and the contact electrode 130, electric current flowing through the second pad electrode 153 is highly likely to flow to the contact electrode 130. For example, the second pad electrode 153 and the second conductive type semiconductor layer 125 can form a Schottky contact. Accordingly, current crowding caused by contact between the second pad electrode 153 and the second conductive type semiconductor layer 125 can be minimized.

Each of the first pad electrode 151 and the second pad electrode 153 may have an upper surface profile corresponding to a lower surface profile thereof. Accordingly, the first pad electrode 151 may include a depression 151a disposed above the third opening 140a and the second pad electrode 153 may include a depression 153a disposed above the fourth opening 140b. In this way, since the lower surface of each of the first and second pad electrodes 151, 153 has a step, each of the first and second pad electrodes 151, 153 has an increased contact area and the step is disposed at a contact portion of each of the first and second pad electrodes 151, 153, thereby preventing peeling of the first and second pad electrodes 151, 153. Particularly, in the structure wherein the contact electrode 130 includes the second opening 130b, the depression 153a of the second pad electrode 153 has a step, thereby more effectively preventing peeling of the second pad electrode 153.

A shortest distance D1 between the first pad electrode 151 and the second pad electrode 153 may be a very small value, for example, about 3 µm to about 20 µm. Since the light reflective insulation layer 140 covering the side surface of the light emitting structure 120 can be stably formed, the light emitting diode chip 100 may be disposed so as to allow bonding portions 211, 213 bonded to a second substrate 300 to cover the side surface of the light emitting diode chip 100, as described in the following exemplary embodiments. In this structure, since there is no need for process margin through the shortest distance D1 between the first pad electrode 151 and the second pad electrode 153, the shortest distance D1 between the first pad electrode 151 and the second pad electrode 153 can be reduced as much as possible. In addition, since the compact light emitting diode chip 100 according to this exemplary embodiment can be operated by relatively low current density, the shortest distance between the first pad electrode 151 and the second pad electrode 153 can be further reduced. Within the above range of the shortest distance D1 between the first pad electrode 151 and the second pad electrode 153, the light emitting diode chip 100 can have further improved heat dissipation efficiency. In this exemplary embodiment, a total area of the first pad electrode 151 and the second pad electrode 153 may range from about 80% to 95% of a horizontal cross-sectional area of the light emitting diode chip 100.

Figure 4:
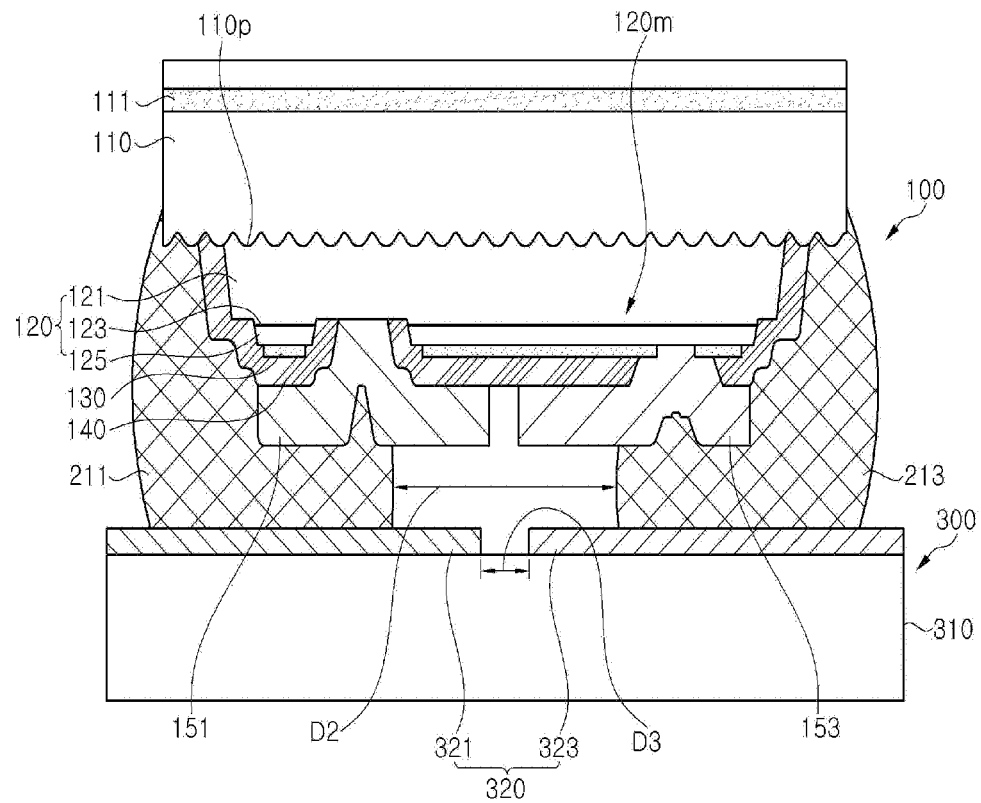
FIG. 4 is a cross-sectional view of a light emitting device according to an exemplary embodiment of the present disclosure.

FIG. 4 is a cross-sectional view of a light emitting device according to one exemplary embodiment of the present disclosure.

Referring to FIG. 4, the light emitting device according to an exemplary embodiment may include a second substrate 300, a light emitting diode chip 100 disposed on the second substrate 300, a first bonding portion 211, and a second bonding portion 213.

The second substrate 300 may provide a region on which the light emitting diode chip 100 will be mounted, and may include, for example, a substrate of a light emitting diode package or a substrate of a light emitting module. The second substrate 300 may include a base 310 and first and second conductive patterns 321, 323 disposed on the base 310. The second substrate 300 may include a conductive substrate, an insulating substrate, or a printed circuit board (PCB). For example, as shown in FIG. 4, the second substrate 300 may include an insulating base 310 and first and second conductive patterns 321, 323 disposed on the base 310 and separated from each other to be electrically isolated from each other. For example, the first and second conductive patterns 321, 323 may be separated from each other by a distance D3 to be electrically isolated from each other. In this exemplary embodiment, the first and second conductive patterns 321, 323 may be electrically connected to the first pad electrode 151 and the second pad electrode 153 of the light emitting diode chip 100, respectively. It should be understood that other implementations are also possible. For example, the second substrate 300 may have any structure so long as the second substrate can provide a region on which the light emitting diode chip 100 will be mounted, and can form electrical connection to the light emitting diode chip 100.

The light emitting diode chip 100 is disposed on the second substrate 300 and electrically connected to the second substrate 300. The light emitting diode chip 100 may be the light emitting diode chip 100 according to the exemplary embodiments described with reference to FIG. 1 to FIG. 3.

The first bonding portion 211 and the second bonding portion 213 are interposed between the light emitting diode chip 100 and the second substrate 300 so as to bond and electrically connect the light emitting diode chip 100 to the second substrate 300. The first bonding portion 211 may contact the first pad electrode 151 of the light emitting diode chip 100 and the first conductive pattern 321 of the second substrate 300. Likewise, the second bonding portion 213 may contact the second pad electrode 153 of the light emitting diode chip 100 and the second conductive pattern 321 of the second substrate 300. The first and second bonding portions 211, 213 may be formed of any material so long as the material can electrically connect the light emitting diode chip 100 to the second substrate 300 while bonding the same, and may include, for example, solder.

In addition, at least one of the first bonding portion 211 and the second bonding portion 213 may contact at least part of the side surface of the light emitting diode chip 100. In this exemplary embodiment, at least one of the first bonding portion 211 and the second bonding portion 213 may cover at least part of the side surface of the light reflective insulation layer 140 covering the side surface of the light emitting structure 120, may further cover at least part of the lower surface of the substrate 110 exposed around the light emitting structure 120, and may further cover at least part of the side surface of the substrate 110.

As such, since at least one of the first bonding portion 211 and the second bonding portion 213 is configured to contact at least part of the side surface of the light emitting diode chip 100, a shortest distance D2 between the first bonding portion 211 and the second bonding portion 213 may be shorter than the shortest distance D1 between the first pad electrode 151 and the second pad electrode 153. Thus, even in the case where D1 has a relatively small value (for example, about 3 μm to 20 μm), D2 can be set to a greater value than D1 so as to prevent short circuit upon mounting of the light emitting diode chip 100. Particularly, since the light reflective insulation layer 140 of the light emitting diode chip 100 stably covers the side surface of the light emitting structure 120, no electrical problem occurs even in the structure wherein the first bonding portion 211 and/or the second bonding portion 213 contact the side surface of the light emitting diode chip 100. Particularly, since the light reflective insulation layer 140 extends to the exposed portion of the upper surface of the substrate 110, the light reflective insulation layer 140 can more stably insulate the side surface of the light emitting structure 120, thereby preventing short circuit through the bonding portions 211, 213 and the side surface of the light emitting structure 120. In addition, since the contact areas between the bonding portions 211, 213 and the light emitting diode chip 100 increase, the light emitting diode chip 100 can be more stably mounted on the substrate, thereby improving mechanical stability of the light emitting device. Furthermore, the thickness of each of the bonding portions 211, 213 interposed between the light emitting diode chip 100 and the second substrate 300 (i.e. the separation distance between the light emitting diode chip 100 and the second substrate 300) can be reduced, thereby realizing a more compact and slimmer light emitting device.

FIG. 5A to FIG. 10B are plan views and cross-sectional views illustrating a method of fabricating a light emitting diode chip according to an exemplary embodiment of the present disclosure.

Detailed description of substantially the same components as those of the above exemplary embodiments will be omitted. Although the drawings of the following exemplary embodiment show a method of fabricating two light emitting diode chips 100, it should be understood that other implementations are also possible. The method of fabricating the light emitting diode chip 100 according to the exemplary embodiment may also be applied to fabrication of a single light emitting diode chip 100 and to fabrication of three or more light emitting diode chips 100 on a large wafer. In each of the drawings, line L1 is defined as a boundary line between unit diode regions UD1. That is, light emitting structures 120 at both sides with reference to the line L1 are divided to provide two light emitting diode chips 100. In addition, each of the cross-sectional views is taken along line B-B' of the corresponding plan view. For example, a cross-section taken along line B-B' of FIG. 5A is shown in FIG. 5B.

Figure 5A:
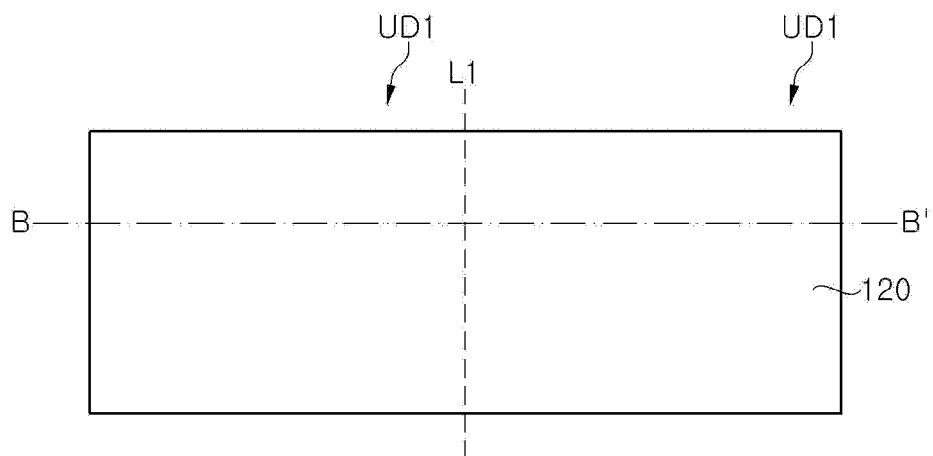
FIG. 5A, FIG. 5B, FIG. 6A, FIG. 6B, FIG. 7A, FIG. 7B, FIG. 8A, FIG. 8B, FIG. 9A, FIG. 9B, FIG. 10A, and FIG. 10B are plan views and cross-sectional views illustrating a method of fabricating a light emitting diode chip according to exemplary embodiments of the present disclosure.
Figure 5B:
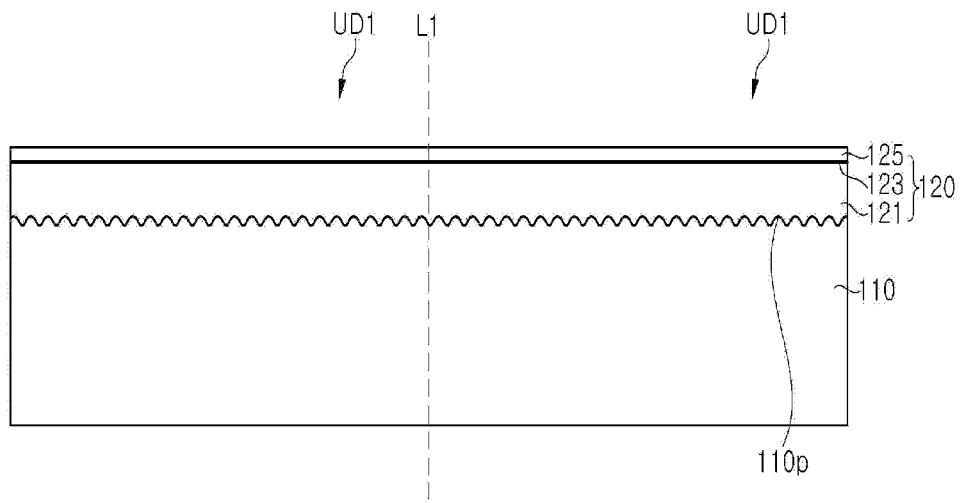

Referring to FIG. 5A and FIG. 5B, a light emitting structure 120 is disposed on a substrate 110. The light emitting structure 120 may be formed by various methods known in the art, for example, metal organic chemical vapor deposition (MOCVD), molecular beam epitaxy (MBE) or hydride vapor phase epitaxy (HVPE).

Referring to FIG. 6A to FIG. 7B, at least one hole 120h and a contact electrode 130 are disposed on the light emitting structure 120. Further, the light emitting structure 120 is partially removed to form an isolation trench 120i that exposes an upper surface of the substrate 110.

Figure 6A:
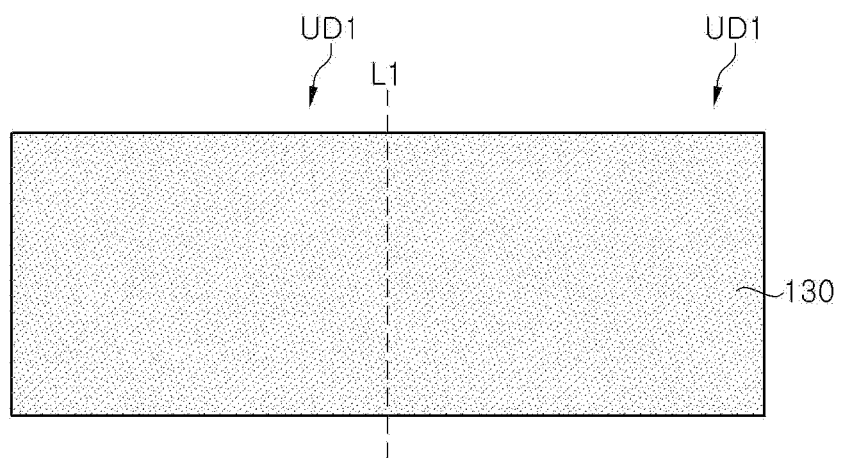
Figure 6B:
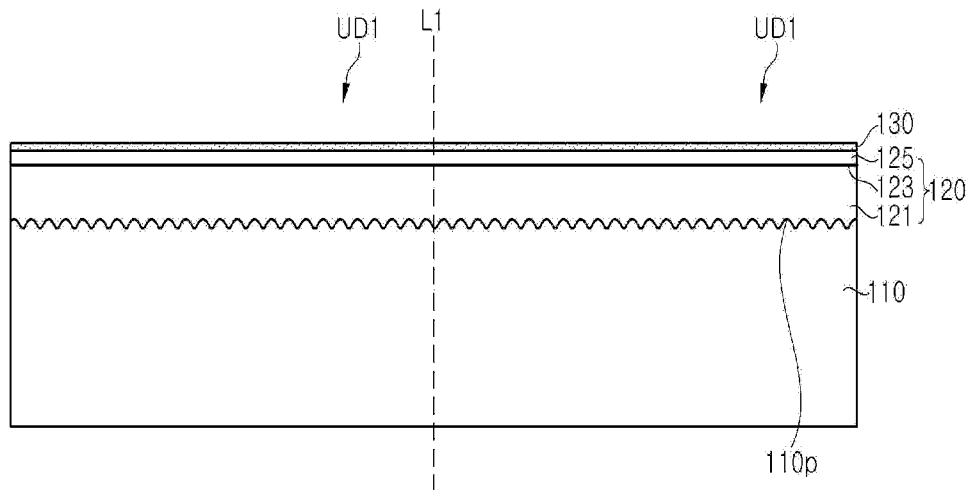

Specifically, first, referring to FIG. 6A and FIG. 6B, the contact electrode 130 is disposed on the light emitting structure 120.

The contact electrode 130 is disposed on a second conductive type semiconductor layer 125 of the light emitting structure 120 and may be in ohmic contact with the second conductive type semiconductor layer 125. The contact electrode 130 may include an optically transparent conductive oxide and/or an optically transparent metal. For example, formation of the contact electrode 130 may include depositing indium tin oxide (ITO) on the second conductive type semiconductor layer 125 through sputtering and/or e-beam evaporation. However, it should be understood that other implementations are also possible. Alternatively, the contact electrode 130 may include various kinds of optically transparent conductive oxides such as ZnO and may be formed by various processes depending upon the kind of conductive oxide.

Figure 7A:
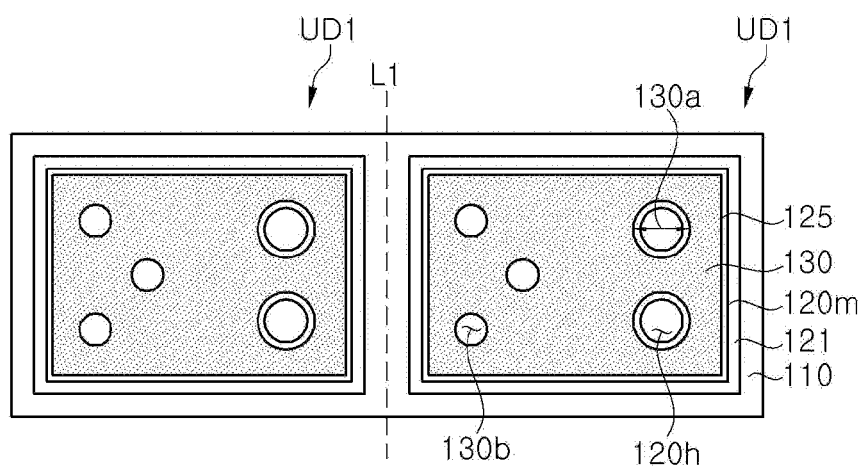
Figure 7B:
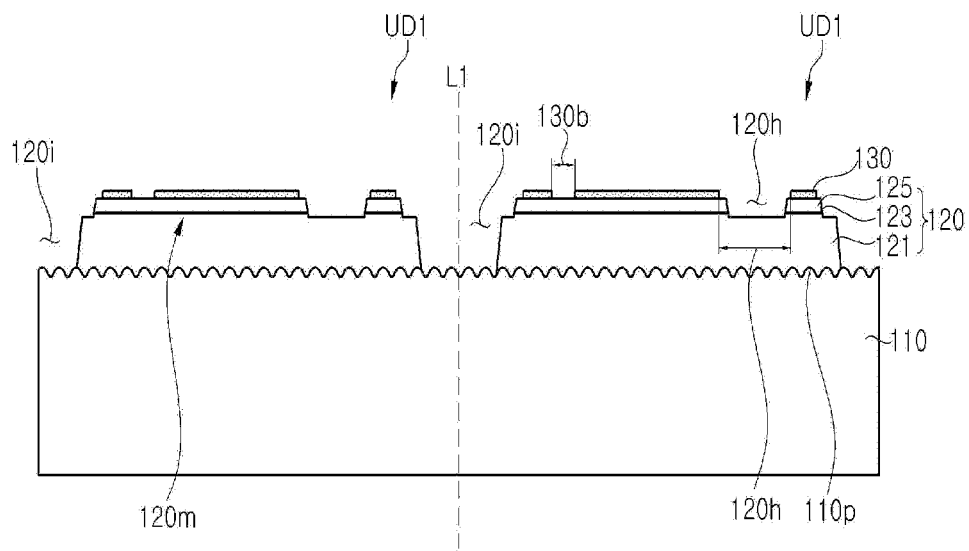

Next, referring to FIG. 7A and FIG. 7B, at least one hole 120h is disposed through the second conductive type semiconductor layer 125 and the active layer 123 by patterning the light emitting structure 120. Further, an isolation trench 120i is formed through the second conductive type semiconductor layer 125, the active layer 123 and the first conductive type semiconductor layer 121 so as to expose an upper surface of the substrate 110 by patterning the light emitting structure 120. Patterning of the light emitting structure 120 may be performed by, for example, dry etching and/or wet etching.

The light emitting structure 120 is divided by the isolation trench 120i into a plurality of light emitting structures 120 respectively disposed on a plurality of unit diode regions UD1. Accordingly, the isolation trench 120i may be disposed along line L1. In this way, the light emitting structure 120 is divided into the plurality of light emitting structures 120 respectively disposed on the plurality of unit diode regions UD1 by forming the isolation trench 120i, thereby relieving stress caused by difference in coefficient of thermal expansion between the substrate 110 and the light emitting structure 120. As a result, it is possible to suppress wafer bowing during fabrication of the light emitting diode chips 100.

The contact electrode 130 may be subjected to patterning and patterning of the contact electrode 130 may include forming first openings 130a that expose the at least one hole 120h. In addition, patterning of the contact electrode 130 may further include forming second openings 130b that partially expose the second conductive type semiconductor layer 125. Patterning of the contact electrode 130 may be performed by dry etching and/or wet etching.

Although the contact electrode 130 is illustrated as being formed prior to patterning of the light emitting structure 120 in the above exemplary embodiment, it should be understood that other implementations are also possible. In various exemplary embodiments, the contact electrode 130 may be formed on the second conductive type semiconductor layer 125 after patterning the light emitting structure 120.

Figure 8A:
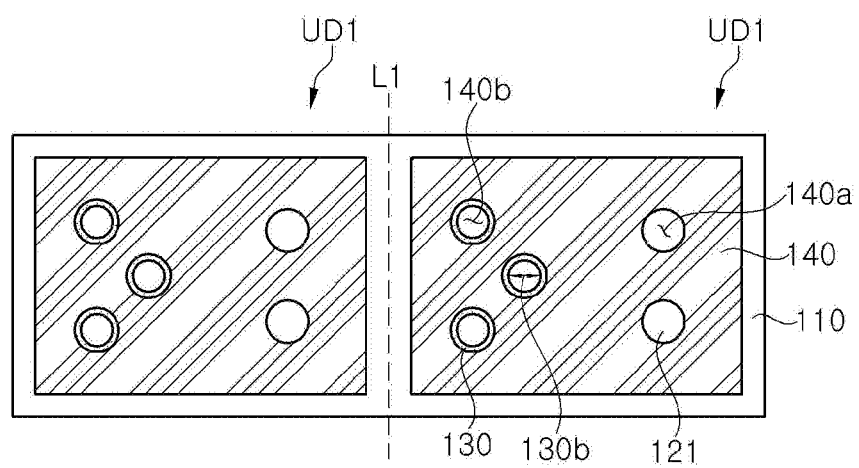
Figure 8B:
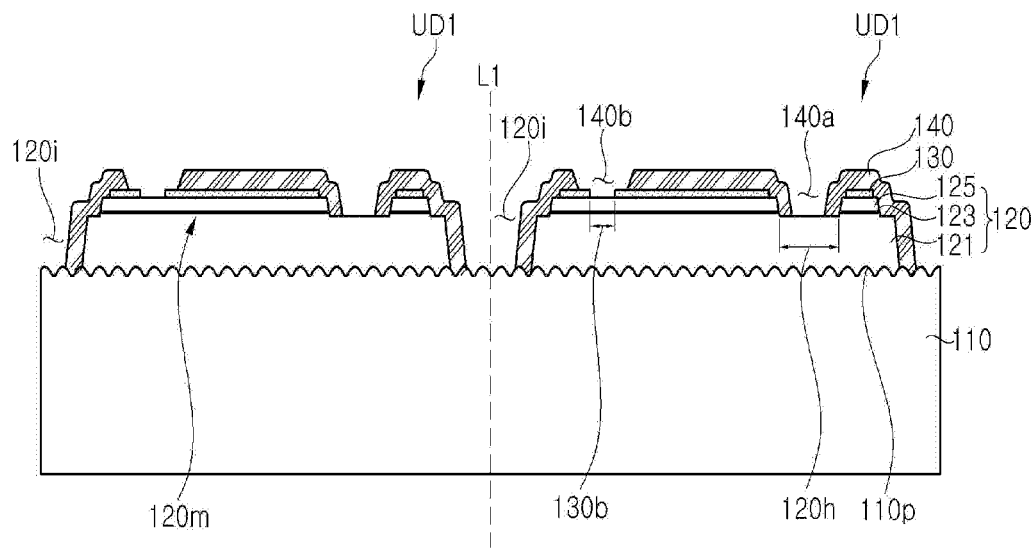

Next, referring to FIG. 8A and FIG. 8B, a light reflective insulation layer 140 including third openings 140a and fourth openings 140b is disposed so as to cover an upper surface and a side surface of the light emitting structure 120.

Formation of the light reflective insulation layer 140 may include forming a distributed Bragg reflector (DBR) in which material layers having different indices of refraction are alternately stacked one above another. For example, formation of the light reflective insulation layer 140 may include alternately stacking a $SiO_2$ layer and a $TiO_2$ layer using a well-known method such as sputtering. In addition, formation of the light reflective insulation layer 140 may include forming the distributed Bragg reflector so as to cover the upper and side surfaces of the light emitting structure 120 and the isolation trench 120i, and patterning the distributed Bragg reflector so as to form the third openings 140a and the fourth openings 140b while exposing the upper surface of the substrate 110 in the isolation trench 120i. Accordingly, the light reflective insulation layer 140 covering the light emitting structure 120 in one unit diode region UD1 is separated from the light reflective insulation layer 140 covering the light emitting structure 120 in another unit diode region UD1.

Figure 9A:
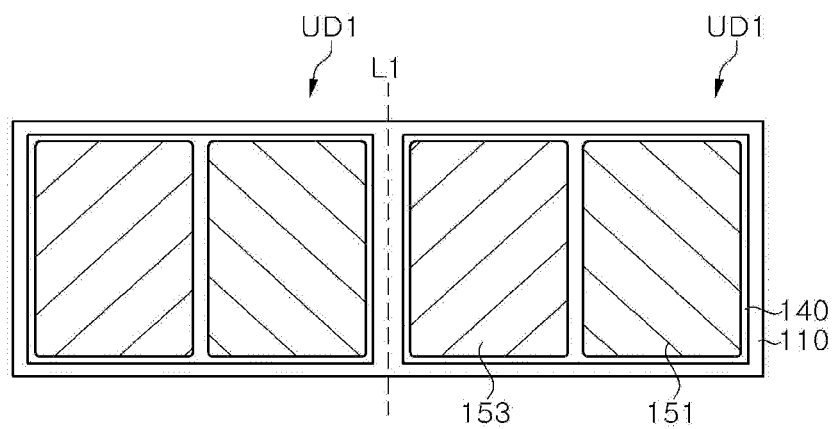
Figure 9B:
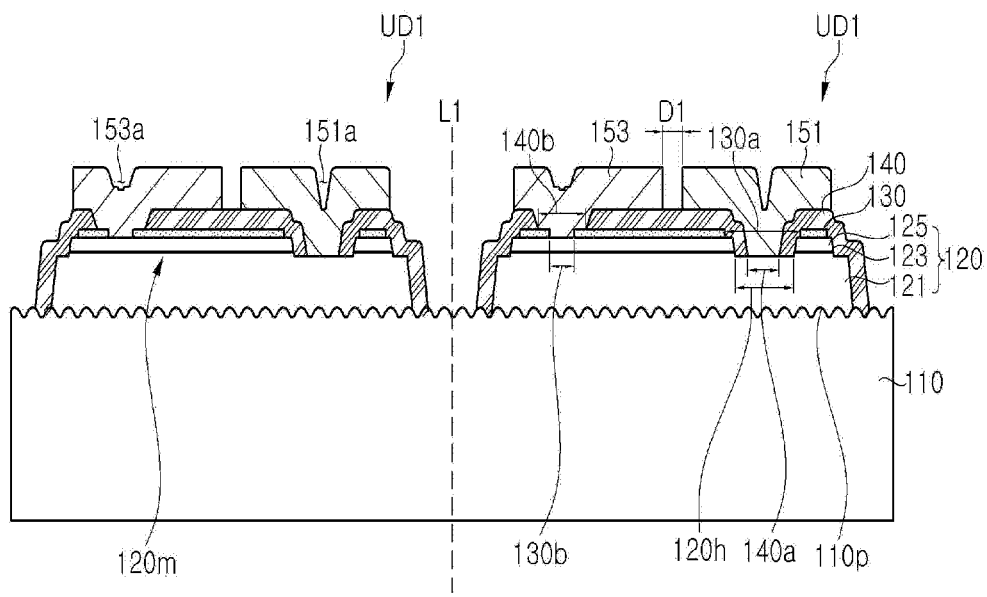

Next, referring to FIG. 9A and FIG. 9B, a first pad electrode 151 and a second pad electrode 153 may be disposed on the light reflective insulation layer 140.

The first pad electrode 151 may be in ohmic contact with the first conductive type semiconductor layer 121 through the third openings 140a of the light reflective insulation layer 140. Likewise, the second pad electrode 153 may contact and be electrically connected to the contact electrode 130 through the fourth openings 140b of the light reflective insulation layer 140. The first and second pad electrodes 151, 153 may be formed by the same processes, for example, through deposition and/or plating, followed by patterning through photolithography/etching technology or lift-off technology.

Figure 10A:
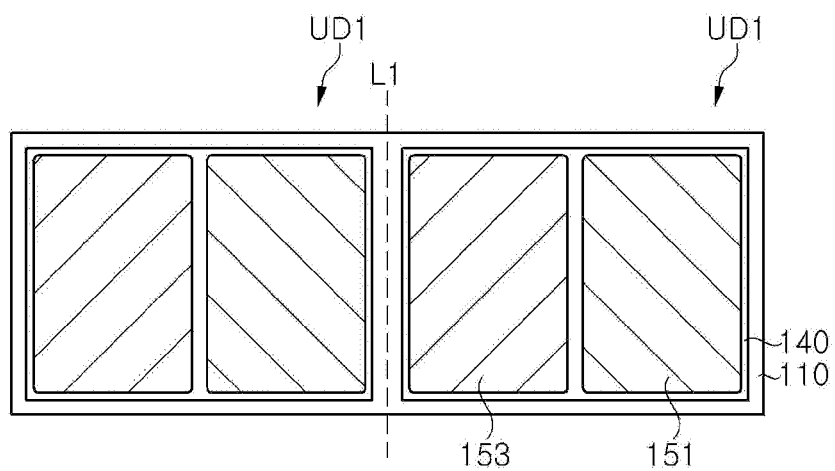
Figure 10B:
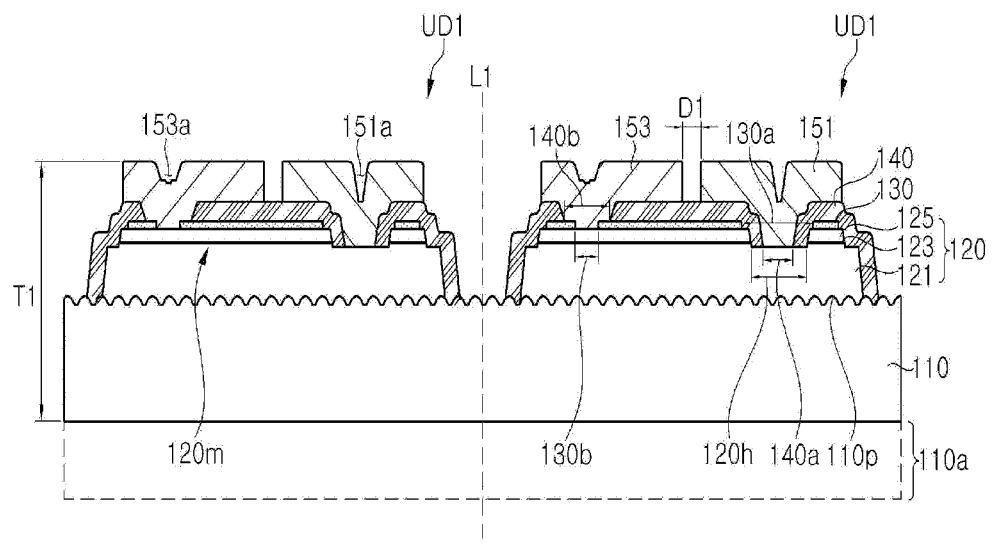

Next, referring to FIG. 10A and FIG. 10B, a portion 110a of the substrate 110 may be removed so as to reduce the thickness of the substrate 110. As a result, the thickness of each of the unit diode regions UD1 may be reduced by T1. Then, the substrate 110 may be divided along line L1, thereby providing a plurality of light emitting diode chips 100, as shown in FIG. 1 to FIG. 3.

Removal of the portion 110a of the substrate 110 may include partially removing the substrate 110 through physical and/or chemical methods. For example, the substrate 110 may be partially removed by lapping, grinding, and the like. Reduction in thickness of the substrate 110 can cause increase in stress while the substrate 110 supports a wafer in a bowed state due to difference in coefficient of thermal expansion. As a result, stress applied to the light emitting structure 120 increases, thereby causing a high probability of damage to the light emitting structure 120. However, according to this exemplary embodiment, the isolation trench 120i dividing the light emitting structure 120 into the plurality of light emitting structure 120 is formed before decreasing the thickness of the substrate 110, thereby preventing damage to the light emitting structure 120 caused by reduction in thickness of the substrate 110 by relieving wafer bowing and stress. Particularly, since stress can be further relieved due to the relatively small unit diode regions UD1, the thickness of each of the unit diode regions UD1 can be reduced to about 90 μm or less.

Division of the substrate 110 along line L1 may include dividing the substrate 110 through scribing and breaking. In some exemplary embodiments, scribing may include internal machining of the substrate 110 using an internal machining laser (for example, stealth laser). With the internal machining laser, at least one modification region 111 having a band shape extending in the horizontal direction may be formed on at least one side surface of the substrate 110.

According to this exemplary embodiment, the isolation trench 120i is disposed along line L1 and the light reflective insulation layer 140 is divided so as to expose the isolation trench 120i. Accordingly, the light reflective insulation layer 140 is not affected or damaged by a laser beam in the course of dividing the substrate 110, thereby preventing damage to the light reflective insulation layer 140 (for example, peeling, breakage, and the like). Particularly, in the structure wherein the light reflective insulation layer 140 includes the distributed Bragg reflector, damage to the light reflective insulation layer 140 can cause deterioration in reflectivity. The fabrication method according to this exemplary embodiment can prevent deterioration in luminous efficacy of the light emitting diode chip 100 caused by damage to the light reflective insulation layer 140.

In the light emitting diode chip 100 and the light emitting device according to the above exemplary embodiments, the upper surface of the substrate 110 includes an exposed portion, thereby suppressing wafer bowing during fabrication of the light emitting diode chip 100. As a result, since the degree of wafer bowing is relatively small, the thickness of the substrate 110 can be reduced while improving production yield of the light emitting diode chip 100, as described above. Thus, the light emitting diode chip 100 and the light emitting device have a compact and slim structure and high reliability. Further, since the light reflective insulation layer 140 extends to cover the side surface of the light emitting structure 120 and the exposed portion of the upper surface of the substrate 110, particularly, the protrusions 110p of the substrate 110, the light emitting diode chip 100 can have further improved luminous efficacy. Furthermore, with such a structure of the light reflective insulation layer 140, the bonding portions 211, 213 can cover the side surface of the light emitting diode chip 100, thereby achieving compactness of the light emitting device while improving mechanical stability thereof.

As such, with good properties in terms of mechanical stability and luminous efficacy and the compact and slim structure, the light emitting device according to the exemplary embodiments can be advantageously applied to portable electronic apparatuses. By way of example, the light emitting device or the light emitting diode chip 100 may be applied to a paper writing board that requires a slim thickness. In another example, the light emitting device may be applied to an input device such as a keyboard, in which the light emitting device is disposed under each key to allow light to be emitted through the keys. In such an input device, the keys are subjected to repeated external stress (for example, pressure applied for data input). In addition, a portable input device requires a slim thickness and a small size. The light emitting device according to the exemplary embodiments having such a compact and slim structure may be suitably applied to a portable input device having a slim structure while securing mechanical stability, thereby preventing failure of the light emitting device caused by operation of the keyboard (for example, pressure applied to the key).

Figure 11:
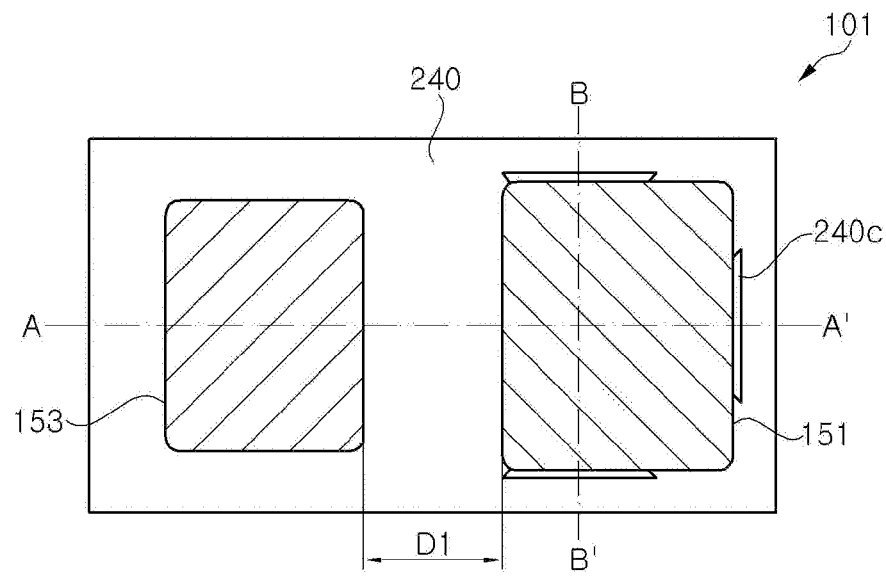
FIG. 11, FIG. 12, and FIG. 13 are plan views of a light emitting diode chip according to an exemplary embodiment of the present disclosure.
Figure 12:
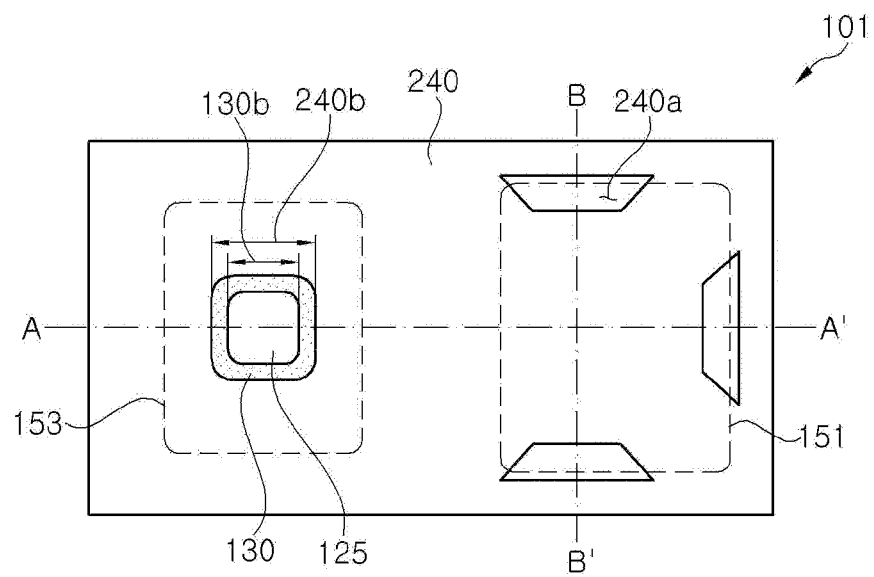
Figure 13:
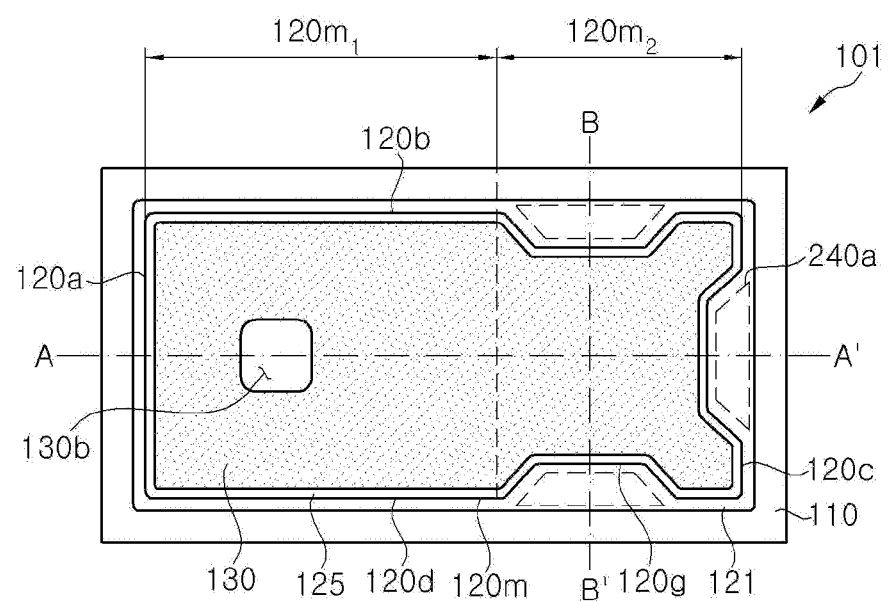

FIG. 11 to FIG. 13 are plan views of a light emitting diode chip according to another exemplary embodiment of the present disclosure. Specifically, FIG. 11 is a plan view of a light emitting diode chip 101, FIG. 12 is a plan view of the light emitting diode chip 101, in which first and second pad electrodes 151, 153 of the light emitting diode chip 101 are omitted for convenience of description, and FIG. 13 is a plan view of the light emitting diode chip 101 in which the first and second pad electrodes 151, 153, and an insulation layer 240 are omitted for convenience of description. Detailed description of components similar to or substantially the same as the components of the above exemplary embodiments will be omitted.

Figure 14:
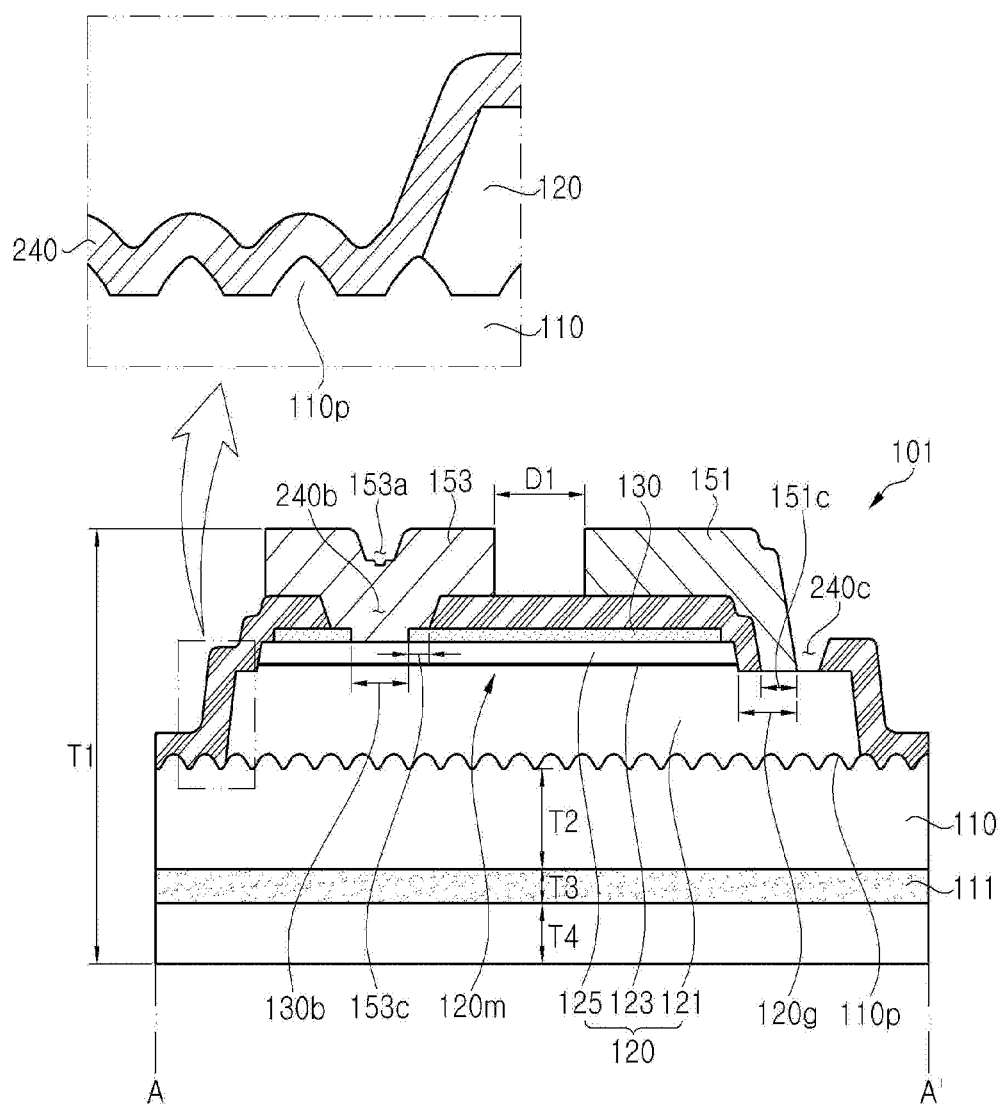
FIG. 14 and FIG. 15 are cross-sectional views of a light emitting diode chip according to an exemplary embodiment of the present disclosure.
Figure 15:
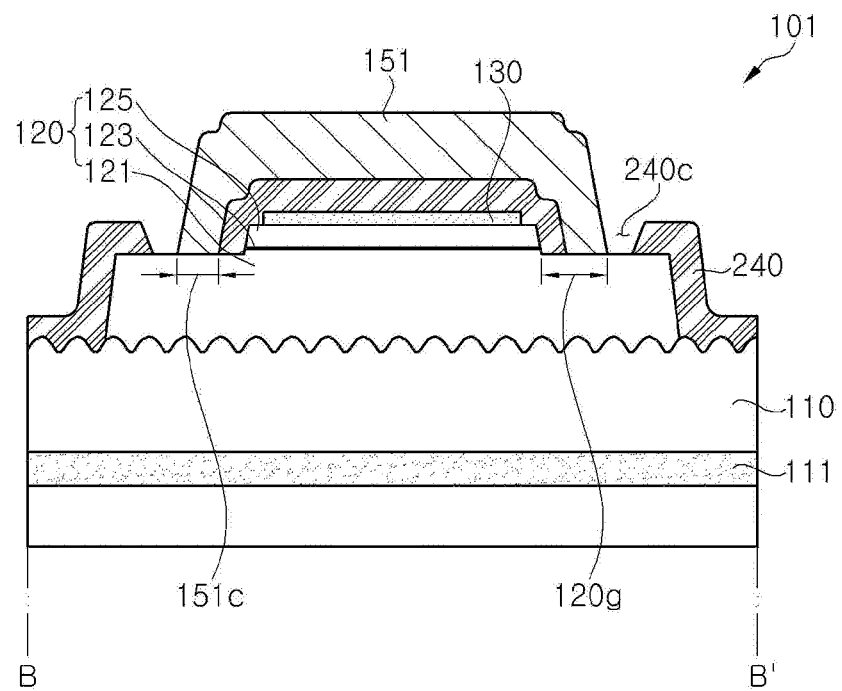

FIG. 14 and FIG. 15 are cross-sectional views of the light emitting diode chip according to the exemplary embodiment of the present disclosure. Specifically, FIG. 14 is a cross-sectional view taken along line A-A' of FIG. 11 to FIG. 13 and FIG. 15 is a cross-sectional view taken along line B-B' of FIG. 11 to FIG. 13.

Figure 16:
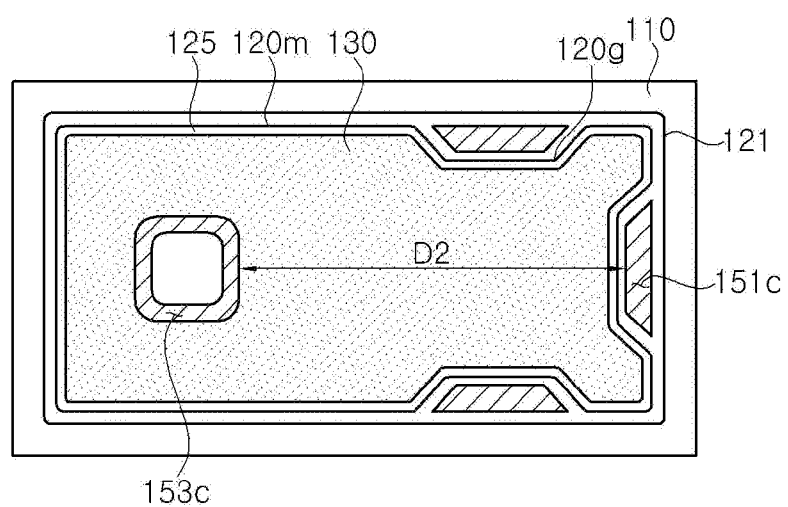
FIG. 16 is a plan view illustrating a current path of a light emitting diode chip according to exemplary embodiments of the present disclosure.

FIG. 16 is a plan view illustrating a current path of a light emitting diode chip according to exemplary embodiments of the present disclosure.

Referring to FIG. 11 to FIG. 15, the light emitting diode chip 101 according to exemplary embodiments includes a substrate 110, a light emitting structure 120, an insulation layer 240, a first pad electrode 151, and a second pad electrode 153. The light emitting diode chip 101 may further include a contact electrode 130.

The light emitting diode chip 101 may be a compact light emitting diode chip having a relatively small horizontal area. The light emitting diode chip 101 may have a horizontal cross-sectional area of about 70,000 μm² or less, specifically about 30,000 μm² to about 70,000 μm². For example, the light emitting diode chip 101 may have a size of 310 μm×180 μm or 330 μm×200 μm. It should be understood that the size of the light emitting diode chip 100 according to exemplary embodiments is not limited thereto. In some exemplary embodiments, the light emitting diode chip 100 may be a compact light emitting diode chip having a relative slim thickness. The light emitting diode chip 101 may have a thickness T1 of about 90 μm or less, specifically a thickness T1 of about 40 μm to 90 μm, for example, a thickness T1 of about 80 μm. With the horizontal cross-sectional area and thickness as described above, the light emitting diode chip 100 according to the exemplary embodiments can be easily applied to various electronic apparatuses that require compact and/or slim light emitting devices. Drive current for operation of the light emitting diode chip 100 may have a current density of 5 mA/mm² to 400 mA/mm². By operation of the light emitting diode chip 101 with such a current density, the light emitting diode chip 100 according to the exemplary embodiments can be suitably applied to various electronic apparatuses that require compact and/or slim light emitting devices.

The substrate 110 may be an insulating or conductive substrate. The substrate 110 may be a growth substrate for growth of the light emitting structure 120, and may include a sapphire substrate, a silicon carbide substrate, a silicon substrate, a gallium nitride substrate, an aluminum nitride substrate, and the like. The substrate 110 may include a plurality of protrusions 110p disposed on some region of an upper surface thereof.

Furthermore, the substrate 110 may include at least one modification region 111 having a band shape and extending from at least one side surface of the substrate 110 in the horizontal direction. The modification region 111 may be formed during division of the substrate 110 for diode isolation. For example, the modification region 111 may be formed through internal machining of the substrate 110. A scribing plane may be formed inside the substrate 110 using an internal machining laser. Although the modification region 111 is illustrated as being disposed inside the substrate 110 in the cross-sectional views of FIG. 14 and FIG. 15 for convenience of description, the modification region 111 may be disposed on at least one side surface of the substrate 110.

In this exemplary embodiment, a distance T2 from the modification region 111 to an upper surface of the substrate 110 may be smaller than a distance T4 from the modification region 111 to a lower surface of the substrate 110. Further, thickness T3 of the modification region 111 may be greater than T4. For example, the distance T2 may range from about 30 μm to about 35 μm, the thickness T3 may range from about 15 μm to about 20 μm, and the distance T4 may range from about 20 μm to about 25 μm.

In consideration of light emitted through a side surface of the light emitting diode chip 101, laser machining is performed relatively near the lower surface of the substrate 110 such that the modification region 111 is disposed relatively near the lower surface of the substrate 110, thereby improving extraction of light from the light emitting structure 120.

On the other hand, the structure wherein the modification region 111 is disposed near the light emitting structure 120 can cause a problem in electrical characteristics due to damage to nitride-based semiconductors upon laser machining. Particularly, when laser machining is performed on a portion within a distance of 40 μm from the nitride-based semiconductor layer, semiconductor layers disposed on the portion subjected to laser machining can be damaged. Conversely, for the light emitting diode chip 101 according to this exemplary embodiment, the upper surface of the substrate 110 may be exposed through isolation of the light emitting structure 120 before division of the substrate 110 and laser machining may be performed under the exposed portion of the upper surface of the substrate 110. Thus, it is possible to prevent damage to the nitride-based semiconductor layers, that is, the light emitting structure 120, during laser internal machining. Accordingly, the distance T2 from the modification region 111 to the upper surface of the substrate 110 can be set to a relatively small thickness in the above range of about 30 μm to 35 μm. In this way, since the distance T2 can be decreased, the modification region 111 can be disposed relatively near the upper surface of the substrate 110 and thus the thickness of the substrate 110 can be further decreased, whereby the light emitting diode chip 101 can have a slimmer structure.

A lower surface of the light emitting structure 120 may have a smaller area than the upper surface of the substrate 110, whereby the upper surface of the substrate 110 can be exposed in at least some region around the light emitting structure 120. Some of the plurality of protrusions 110*p* may be disposed between the light emitting structure 120 and the substrate 110, and the other protrusions 110*p* not covered by the light emitting structure 120 may be exposed around the light emitting structure 120.

With the structure wherein the upper surface of the substrate 110 is partially exposed around the light emitting structure 120, the light emitting diode chip 101 can prevent damage to the light emitting structure 120 by suppressing wafer bowing during fabrication thereof, thereby improving production yield. In addition, the light emitting diode chip 101 can reduce stress applied to the light emitting structure 120 by suppressing wafer bowing, thereby allowing the substrate 110 to be machined to a slimmer thickness. As a result, the light emitting diode chip 101 can have a slim structure having a thickness of about 90 µm or less. This structure will be described in more detail in the following exemplary embodiments.

The light emitting structure 120 includes a first conductive type semiconductor layer 121, a second conductive type semiconductor layer 125 disposed on the first conductive type semiconductor layer 121, and an active layer 123 interposed between the first conductive type semiconductor layer 121 and the second conductive type semiconductor layer 125. In this exemplary embodiment, the second conductive type semiconductor layer 125 may be a p-type semiconductor layer.

The light emitting structure 120 includes a mesa 120*m*. The mesa 120*m* may be disposed in some region of the first conductive type semiconductor layer 121 and includes the active layer 123 and the second conductive type semiconductor layer 125. In this structure, the first conductive type semiconductor layer 121 may be partially exposed around the mesa 120*m*. In addition, the mesa 120*m* may have side surfaces generally disposed along side surfaces of the light emitting diode chip 101, and thus has a similar shape to the shape of the light emitting diode chip 101 in plan view. For example, the mesa 120*m* may have a rectangular shape in plan view. It should be understood that other implementations are also possible. Further, the mesa 120*m* may include a first side surface 120*a*, a third side surface 120*c* disposed opposite the first side surface 120*a*, a second side surface 120*b*, and a fourth side surface 120*d* opposite the second side surface 120*b*.

The mesa 120*m* may include a first portion $120m_1$ and a second portion $120m_2$. The first portion $120m_1$ of the mesa 120*m* includes at least one groove 120*g* disposed on the side surface of the mesa 120*m*. In this exemplary embodiment, the mesa 120*m* may include a plurality of grooves 120*g*, which may be disposed on at least three side surfaces of the first portion 120*m*1. As shown in the drawings, the plurality of grooves 120*g* may be disposed on the second side surface 120*b*, the third side surface 120*c* and the fourth side surface 120*d*, respectively. The grooves 120*g* can provide a region in which the first pad electrode 151 and the first conductive type semiconductor layer 121 form electrical contact and ohmic contact with each other.

In addition, the grooves 120*g* may have a width gradually decreasing from one side of the mesa 120*m* to the center of the mesa 120*m*. Accordingly, when the first pad electrode 151 is disposed to cover the side surfaces of the grooves 120*g*, the first pad electrode 151 can be more stably formed and can be prevented from being separated from the insulation layer 240. Obviously, the grooves 120*g* are not limited to the above structure and may include planar and/or curved side surfaces. In one exemplary embodiment, the grooves 120*g* may be regularly arranged. For example, the grooves 120*g* may be arranged such that one groove 120*g* is disposed substantially at the center of the third side surface 120*c* and grooves disposed on the second side surface 120*b* and the fourth side surface 120*d* are collinear with each other (for example, such that the centers of the grooves 120*g* are disposed along line B-B'). Accordingly, the grooves 120*g* are arranged in symmetry with respect to a linear line (imaginary line) extending from the first side surface 120*a* of the mesa 120*m* to the third side surface 120*c*. In this exemplary embodiment, the grooves 120*g* may be arranged in symmetry with respect to line A-A' and the mesa 120*m* may have a symmetrical shape with respect to line A-A' in plan view, as shown in the drawings.

In the structure wherein the mesa 120*m* includes the grooves 120*g* arranged as described above, the grooves 120*g* provide contact regions between the first conductive type semiconductor layer 121 and the first pad electrode 151, thereby minimizing decrease in luminous area while improving current spreading efficiency. These effects will be described in more detail below with reference to FIG. 16.

The contact electrode 130 is disposed on the second conductive type semiconductor layer 125. The contact electrode 130 may be in ohmic contact with the second conductive type semiconductor layer 125. The contact electrode 130 may include a transparent electrode. Particularly, the contact electrode 130 including an optically transparent conductive oxide has high efficiency in formation of an ohmic contact with the second conductive type semiconductor layer 125. That is, since contact resistance between a conductive oxide such as ITO or ZnO and the second conductive type semiconductor layer 125 is lower than contact resistance between a metallic electrode and the second conductive type semiconductor layer 125, the contact electrode 130 including the conductive oxide can reduce forward voltage $V_f$ of the light emitting diode chip 101, thereby improving luminous efficacy. Particularly, in a compact light emitting diode chip driven by relatively low current density like the light emitting diode chip 101 according to this exemplary embodiment, the contact resistance between the contact electrode 130 and the second conductive type semiconductor layer 125 is reduced so as to improve ohmic contact characteristics, thereby more effectively improving luminous efficacy. Further, since the conductive oxide has a lower probability of peeling off of the nitride-based semiconductor layer than the metallic electrode, the light emitting diode chip 100 having the contact electrode 130 including the conductive oxide has high reliability. On the other hand, although the conductive oxide has lower lateral current spreading efficiency than the metallic electrode, the light emitting diode chip 101 according to this exemplary embodiment has a horizontal cross-sectional area of about 70,000 µm or less and, thus, suffers from insignificant or no deterioration in luminous efficacy caused by deterioration in current spreading efficiency. In this way, the contact electrode 130 including the conductive oxide is applied to the light emitting diode chip 101, thereby improving electrical characteristics and luminous efficacy.

The contact electrode 130 may have a thickness of about 2,000 Å to 3,000 Å, without being limited thereto. For example, the contact electrode 130 including ITO may have a thickness of about 2,400 Å. Within this thickness range of the contact electrode 130, the light emitting diode chip 101 can exhibit improved electrical characteristics by efficiently spreading electric current in the lateral direction.

The contact electrode 130 may be disposed to cover substantially the entirety of an upper surface of the second conductive type semiconductor layer 125, thereby improving current spreading efficiency upon operation of the light emitting diode chip 101. For example, the side surfaces of the contact electrode 130 may be disposed along the side surfaces of the mesa 120m. In addition, the contact electrode 130 includes an opening 130b that partially exposes the second conductive type semiconductor layer 125. In a structure wherein the opening 130b is at least partially filled with a second pad electrode 153 described below, the second pad electrode 153 can have an increased contact area. Accordingly, the second pad electrode 153 can be effectively prevented from being separated from the contact electrode 130 or the light emitting structure 120.

The insulation layer 240 covers an upper surface and a side surface of the light emitting structure 120 and also covers the contact electrode 130. In addition, the insulation layer 240 may extend to the exposed portion of the upper surface of the substrate 110 around the light emitting structure 120. In this structure, the insulation layer 240 may adjoin the upper surface of the substrate 110 and thus can be more stably disposed while covering the side surface of the light emitting structure 120. Further, the insulation layer 240 may extend to an upper edge of the substrate 110. The insulation layer 240 covering the exposed portion of the upper surface of the substrate 110 may be disposed along the protrusions 110p of the substrate 110. Thus, as shown in an enlarged view of FIG. 14, depressions and protrusions may be disposed on a surface of the insulation layer 240 covering the upper surface of the substrate 110. The insulation layer 240 may include a first opening 240a that at least partially exposes the first conductive type semiconductor layer 121 exposed through at least one groove 120g and a second opening 240b that partially exposes the contact electrode 130. It should be understood that other implementations are also possible. For example, the insulation layer 240 may partially cover the upper surface of the substrate 110 such that the upper surface of the substrate 110 is partially exposed.

The first opening 240a of the insulation layer 240 at least partially exposes the first conductive type semiconductor layer 121 exposed through the groove 120g. In this exemplary embodiment, the side surface of the groove 120g is covered by the insulation layer 240, thereby prevent short circuit caused by contact between the first pad electrode 151 and the side surface of the light emitting structure 120. The first opening 240a may be used as a passage for electrical connection between the first conductive type semiconductor layer 121 and the first pad electrode 151. In this structure, at least part of an exposed region of the first opening 240a may include a first contact region 151c, in which the first pad electrode 151 and the first conductive type semiconductor layer 121 are electrically connected to each other or be in ohmic contact with each other. The first opening 240a may generally have a similar shape to the groove 120g.

The second opening 240b of the insulation layer 240 partially exposes the contact electrode 130. The second opening 240b may be used as a passage for electrical connection between the contact electrode 130 and the second pad electrode 153. In some exemplary embodiments, the second opening 240b is positioned corresponding to a location of the opening 130b of the contact electrode 130. The second opening 240b has a greater size than the opening 130b of the contact electrode 130, whereby the upper surface of the contact electrode 130 is partially exposed to the second opening 240b. At least part of the region of the contact electrode 130 exposed through second opening 240b may be electrically connected to the second pad electrode 153. Accordingly, the contact electrode 130 may include a second contact region 153c in which the contact electrode 130 and the second pad electrode 153 are electrically connected to each other.

The insulation layer 240 may include an optically transparent insulation material, for example, $SiO_2$, $SiN_x$, $MgF_2$, and the like. The insulation layer 240 may have a greater thickness than the contact electrode 130. With this structure, the insulation layer 240 can provide a sufficient thickness to allow light passing through the insulation layer 240 to be reflected by the first and second pad electrodes 151, 153. In this exemplary embodiment, the insulation layer 240 may include $SiO_2$ and has a thickness of, for example, about 540 nm.

In some exemplary embodiments, the insulation layer 240 may include a distributed Bragg reflector. The distributed Bragg reflector may be formed by repeatedly stacking dielectric layers having different indices of refraction and including, for example, $TiO_2$, $SiO_2$, $HfO_2$, $ZrO_2$, $Nb_2O_5$, $MgF_2$, and the like. For example, the insulation layer 240 may have an alternating structure of $TiO_2/SiO_2$ layers. The distributed Bragg reflector may be composed of 4 to 20 pairs of layers each having an optical thickness equal to one-quarter of a particular wavelength. An uppermost layer of the insulation layer 240 may be formed of $SiN_X$. The layer of $SiN_X$ has good moisture resistance to protect the light emitting diode chip from moisture.

In the structure wherein the insulation layer 240 includes the distributed Bragg reflector, the insulation layer 240 may include an interface layer having a thickness of about 0.2 to about 1.0 μm and formed of $SiO_2$ and a stack structure in which $TiO_2/SiO_2$ layers are repeatedly stacked in a predetermined cycle on the interface layer. The distributed Bragg reflector may have a relatively high reflectivity with respect to visible light. The distributed Bragg reflector may be configured to have a reflectivity of 90% or higher with respect to light having an angle of incidence of 0° to 60° at a wavelength of 400 nm to 700 nm. The distributed Bragg reflector having this reflectivity can be provided by controlling the kinds, thickness and stacking cycle of the dielectric layers constituting the distributed Bragg reflector. As a result, it is possible to form a distributed Bragg reflector having high reflectivity with respect to light having relatively long wavelengths (for example, 550 nm to 700 nm) and light having relatively short wavelengths (for example, 400 nm to 550 nm).

In this way, the distributed Bragg reflector may include a multilayer structure so as to have high reflectivity with respect to light in a broad wavelength band. That is, the distributed Bragg reflector may include a first stack structure in which dielectric layers having a first thickness are stacked one above another and a second stack structure in which dielectric layers having a second thickness are stacked one above another. For example, the distributed Bragg reflector may include a first stack structure in which dielectric layers having a smaller thickness than an optical thickness equal to one-quarter of a central wavelength (about 550 nm) of visible light are stacked one above another and a second stack structure in which dielectric layers having a greater thickness than the optical thickness equal to one-quarter of the central wavelength (about 550 nm) of visible light are stacked one above another. In some exemplary embodiments, the distributed Bragg reflector may further include a third stack structure in which a dielectric layer having a greater thickness than the optical thickness equal to one-quarter of the central wavelength (about 550 nm) of visible light and a dielectric layer having a smaller thickness than the optical thickness equal to one-quarter of the central wavelength (about 550 nm) of visible light are repeatedly stacked one above another The first pad electrode 151 and the second pad electrode 153 are disposed on the insulation layer 240 to be disposed on the first portion $120m_1$ and the second portion $120m_2$ of the mesa 120m, respectively. Furthermore, the first pad electrode 151 and the second pad electrode 153 may be disposed near the first side surface 120a and the third side surface 120c of the mesa 120m. At least part of each of the first and second pad electrodes 151, 153 is disposed on the mesa 120m. Particularly, the first pad electrode 151 may be insulated from the upper and side surfaces of the mesa 120m via the insulation layer 240. Further, at least some side surface of the first pad electrode 151 may be separated from a side surface of the first opening 240a so as to define a separation space 240c therebetween.

The first pad electrode 151 disposed on the first portion $120m_1$ may be electrically connected to the first conductive type semiconductor layer 121 through the first opening 240a while being in ohmic contact therewith. Particularly, the first pad electrode 151 may be disposed to cover the side surface of the mesa 120m such that the side surface of the mesa 120m and the first pad electrode 151 are insulated from each other via the insulation layer 240. Accordingly, a contact portion between the first pad electrode 151 and the first conductive type semiconductor layer 121 exposed through the groove 120g is formed as a first contact region 151c. The first conductive type semiconductor layer 121 can be partially exposed through the separation space 240c and process margin can be secured through the separation space 240c, thereby improving production yield of the light emitting diode chip 101. In other exemplary embodiments, the separation space 240c may be omitted and the first pad electrode 151 may be disposed to fill the first opening 240a such that the first opening 240a is not exposed.

The second pad electrode 153 disposed on the second portion $120m_2$ may be electrically connected to the contact electrode 130 through the second opening 240b. In this exemplary embodiment, at least part of a contact region between the second pad electrode 153 and the contact electrode 130 may be disposed as a second contact region 153c. In the structure wherein the contact electrode 130 includes the opening 130b, the second pad electrode 153 may contact the second conductive type semiconductor layer 125. In this structure, however, since contact resistance between the second pad electrode 153 and the second conductive type semiconductor layer 125 is higher than contact resistance between the second pad electrode 153 and the contact electrode 130, electric current flowing through the second pad electrode 153 is highly likely to flow to the contact electrode 130. For example, the second pad electrode 153 and the second conductive type semiconductor layer 125 can form a Schottky contact. Accordingly, current crowding caused by contact between the second pad electrode 153 and the second conductive type semiconductor layer 125 can be minimized.

Referring to FIG. 16, upon operation of the light emitting diode chip 101, electric current can flow through the first contact region 151c from the second contact region 153c. In the structure wherein the grooves 120g are disposed on at least three side surfaces of the mesa 120m, the first contact region 151c is disposed on the surface of the first conductive type semiconductor layer 121 exposed through the grooves 120g, whereby electric current can be efficiently supplied to a side surface the first portion 120m1 of the mesa 120m. Accordingly, electric current can be evenly spread over a luminous region (the active layer 123 of the mesa 120m).

Particularly, in the structure wherein the first conductive type semiconductor layer 121 is an n-type semiconductor layer, electrons spread from the first contact region 151c towards the second contact region 153c upon operation of the light emitting diode chip 101. Here, since electrons have higher mobility than holes, electrons can be evenly spread to a region between the second contact region 153c and the first side surface 120a, whereas holes are not likely to spread to a rear side of the first contact region 151c. According to this exemplary embodiment, the first contact region 151c is disposed at the location of the grooves 120g so as to allow electric current to be evenly spread to edge regions (regions near the side surfaces) of the first portion 120m1, thereby enabling uniform generation of light substantially through the entire region of the mesa 120m. Accordingly, it is possible to improve luminous efficacy of the compact light emitting diode chip 101 having a relatively small luminous area.

In addition, since the grooves 120g are disposed on at least three side surfaces of the mesa 120m, it is possible to minimize a portion of the luminous region to be removed for electrical connection to the first conductive type semiconductor layer 121. Accordingly, the light emitting diode chip 101 having a relatively small luminous area according to the exemplary embodiments can have improved luminous power by minimizing the decrease in luminous area.

A shortest distance D2 from a first contact region 151c disposed farthest away from the second contact region 153c to the second contact region 153c among the first contact regions 151c may be 200 μm or less. That is, as shown in FIG. 16, the shortest distance D2 from the second contact region 153c to the first contact region 151c near the third side surface 120c may be 200 μm or less. For example, if D2 exceeds 200 uneven current spreading occurs near the first contact region 151c disposed farthest away from the second contact region 153c, thereby causing deterioration in luminous efficacy. Particularly, if the contact electrode 130 is formed of a conducive oxide including ITO, current spreading efficiency can be further improved by setting D2 to 200 μm or less due to limitation in current spreading through the contact electrode 130. It should be understood that other implementations are also possible.

Each of the first pad electrode 151 and the second pad electrode 153 may have an upper surface profile corresponding to a lower surface profile thereof. Accordingly, the first pad electrode 151 may include an inclined side surface disposed above the first opening 240a and the second pad electrode 153 may include a depression 153a disposed above the second opening 240b. In this way, since the lower surface of each of the first and second pad electrodes 151, 153 has a step, each of the first and second pad electrodes 151, 153 has an increased contact area and the step is disposed at a contact portion of each of the first and second pad electrodes 151, 153, thereby preventing peeling of the first and second pad electrodes 151, 153. Particularly, in the structure wherein the contact electrode 130 includes the opening 130b, the depression 153a of the second pad electrode 153 has a step, thereby more effectively preventing peeling of the second pad electrode 153. In addition, a step is disposed on the surface of each of the first and second pad electrodes 151, 153, whereby the light emitting diode chip 101 can be more stably bonded to the second substrate 300.

A shortest distance D1 between the first pad electrode 151 and the second pad electrode 153 may be a very small value, for example, about 3 μm to about 100 μm, specifically about 80 μm. Since the insulation layer 240 covering the side surface of the light emitting structure 120 can be stably formed, the light emitting diode chip 101 may be configured so as to allow bonding portions 211, 213 bonded to a second substrate 300 to cover the side surface of the light emitting diode chip 101, as described in the following exemplary embodiments. In this structure, since there is no need for process margin through the shortest distance D1 between the first pad electrode 151 and the second pad electrode 153, the shortest distance D1 between the first pad electrode 151 and the second pad electrode 153 can be reduced as much as possible. In this structure, since there is no need for process margin through the shortest distance D1 between the first pad electrode 151 and the second pad electrode 153, the shortest distance D1 between the first pad electrode 151 and the second pad electrode 153 can be reduced as much as possible.

In addition, since the compact light emitting diode chip 101 according to this exemplary embodiment can be operated by relatively low current density, the shortest distance between the first pad electrode 151 and the second pad electrode 153 can be further reduced. Within the above range of the shortest distance D1 between the first pad electrode 151 and the second pad electrode 153, the light emitting diode chip 101 can have further improved heat dissipation efficiency. In this exemplary embodiment, a total area of the first pad electrode 151 and the second pad electrode 153 may range from about 50% to 95% of a horizontal cross-sectional area of the light emitting diode chip 101. Within this range of the total area ratio of the first and second pad electrodes 151, 153, the light emitting diode chip 101 can have improved luminous efficacy by improving reflection of light through the first and second pad electrodes 151, 153.

Figure 17:
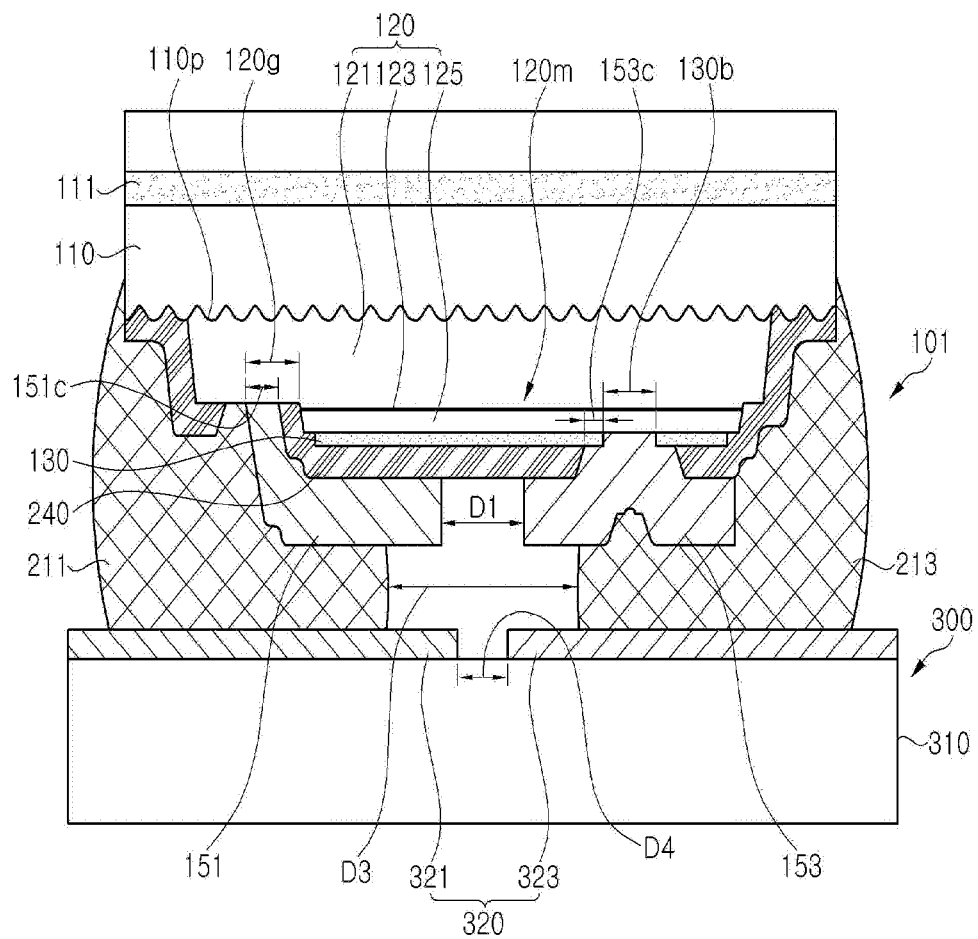
FIG. 17 is a sectional view of a light emitting device according to an exemplary embodiment of the present disclosure.

FIG. 17 is a cross-sectional view of a light emitting device according to another exemplary embodiment of the present disclosure.

Referring to FIG. 17, the light emitting device according to this exemplary embodiment includes a second substrate 300, a light emitting diode chip 101 disposed on the second substrate 300, a first bonding portion 211, and a second bonding portion 213.

The second substrate 300 may provide a region on which the light emitting diode chip 101 will be mounted, and may include, for example, a substrate of a light emitting diode package or a substrate of a light emitting module. The second substrate 300 may include a base 310 and first and second conductive patterns 321, 323 disposed on the base 310. The second substrate 300 may include a conductive substrate, an insulating substrate, or a printed circuit board (PCB). For example, as shown in FIG. 17, the second substrate 300 may include an insulating base 310 and first and second conductive patterns 321, 323 disposed on the base 310 and separated from each other to be electrically isolated from each other. For example, the first and second conductive patterns 321, 323 may be separated from each other by a distance D4 to be electrically isolated from each other. In this exemplary embodiment, the first and second conductive patterns 321, 323 may be electrically connected to the first pad electrode 151 and the second pad electrode 153 of the light emitting diode chip 101, respectively. It should be understood that other implementations are also possible. For example, the second substrate 300 may have any structure so long as the second substrate can provide a region on which the light emitting diode chip 101 will be mounted, and can form electrical connection to the light emitting diode chip 101.

The light emitting diode chip 101 is disposed on the second substrate 300 and is electrically connected to the second substrate 300. The light emitting diode chip 101 may be the light emitting diode chip 101 according to the exemplary embodiments described with reference to FIG. 11 to FIG. 16.

The first bonding portion 211 and the second bonding portion 213 are interposed between the light emitting diode chip 100 and the second substrate 300 so as to bond and electrically connect the light emitting diode chip 100 to the second substrate 300. The first bonding portion 211 may contact the first pad electrode 151 of the light emitting diode chip 101 and the first conductive pattern 321 of the second substrate 300. Likewise, the second bonding portion 213 may contact the second pad electrode 153 of the light emitting diode chip 101 and the second conductive pattern 321 of the second substrate 300. The first and second bonding portions 211, 213 may be formed of any material so long as the material can electrically connect the light emitting diode chip 101 to the second substrate 300 while bonding the same, and may include, for example, solder.

In addition, at least one of the first bonding portion 211 and the second bonding portion 213 may contact at least part of a side surface of the light emitting diode chip 101. In this exemplary embodiment, at least one of the first bonding portion 211 and the second bonding portion 213 may cover at least part of the side surface of the insulation layer 240 covering the side surface of the light emitting structure 120, may further cover at least part of the lower surface of the substrate 110 exposed around the light emitting structure 120, and may further cover at least part of the side surface of the substrate 110.

As such, since at least one of the first bonding portion 211 and the second bonding portion 213 is disposed to contact at least part of the side surface of the light emitting diode chip 101, the shortest distance D3 between the first bonding portion 211 and the second bonding portion 213 may be shorter than the shortest distance D1 between the first pad electrode 151 and the second pad electrode 153. Thus, even in the case where D1 has a relatively small value (for example, about 3 μm to 20 μm), D3 can be set to a greater value than D1 so as to prevent short circuit upon mounting of the light emitting diode chip 100. Particularly, since the insulation layer 240 of the light emitting diode chip 101 stably covers the side surface of the light emitting structure 120, no electrical problem occurs even in the structure wherein the first bonding portion 211 and/or the second bonding portion 213 contact the side surface of the light emitting diode chip 101. Particularly, since the insulation layer 240 extends to the exposed portion of the upper surface of the substrate 110, the insulation layer 240 can more stably insulate the side surface of the light emitting structure 120, thereby preventing short circuit through the bonding portions 211, 213 and the side surface of the light emitting structure 120. In addition, since the contact areas between the bonding portions 211, 213 and the light emitting diode chip 101 increase, the light emitting diode chip 101 can be more stably mounted on the substrate, thereby improving mechanical stability of the light emitting device. Furthermore, the thickness of each of the bonding portions 211, 213 interposed between the light emitting diode chip 101 and the second substrate 300 (that is, the separation distance between the light emitting diode chip 101 and the second substrate 300) can be reduced, thereby realizing a more compact and slimmer light emitting device.

FIG. 18A to FIG. 23B are plan views and cross-sectional views illustrating a method of fabricating a light emitting diode chip 101 according to another exemplary embodiment of the present disclosure.

Detailed description of substantially the same components as those of the above exemplary embodiments will be omitted. Although the drawings of the following exemplary embodiment show a method of fabricating two light emitting diode chips 101, it should be understood that other implementations are also possible. The method of fabricating the light emitting diode chip 101 according to the exemplary embodiment may also be applied to fabrication of a single light emitting diode chip 101 and to fabrication of three or more light emitting diode chips 101 on a large wafer. In each of the drawings, line L1 is defined as a boundary line between unit diode regions UD2. That is, light emitting structures 120 at both sides with reference to the line L1 are divided to provide two light emitting diode chips 101. In addition, each of the cross-sectional views is taken from the corresponding plan view. For example, a cross-section of the plan view of FIG. 18A is shown in FIG. 18B.

Figure 18A:
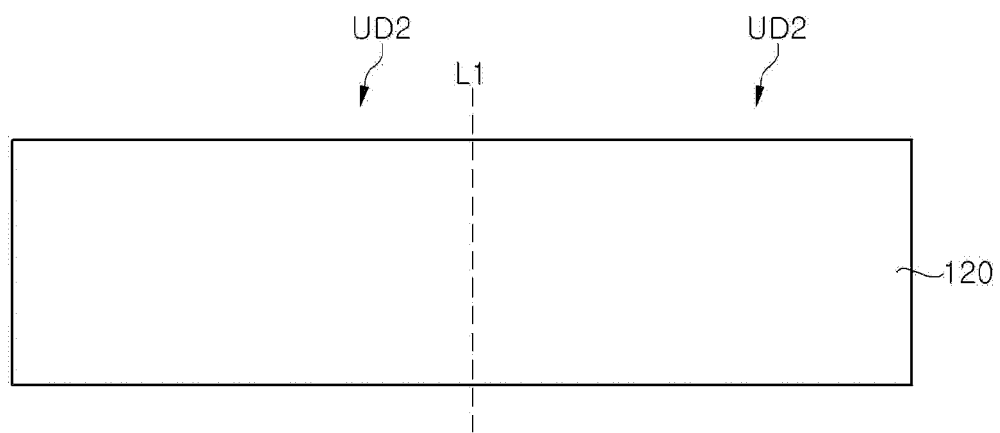
FIG. 18A, FIG. 18B, FIG. 19A, FIG. 19B, FIG. 20A, FIG. 20B, FIG. 21A, FIG. 21B, FIG. 22A, FIG. 22B, FIG. 23A, and FIG. 23B are plan views and cross-sectional views illustrating a method of fabricating a light emitting diode chip according to an exemplary embodiment of the present disclosure.
Figure 18B:
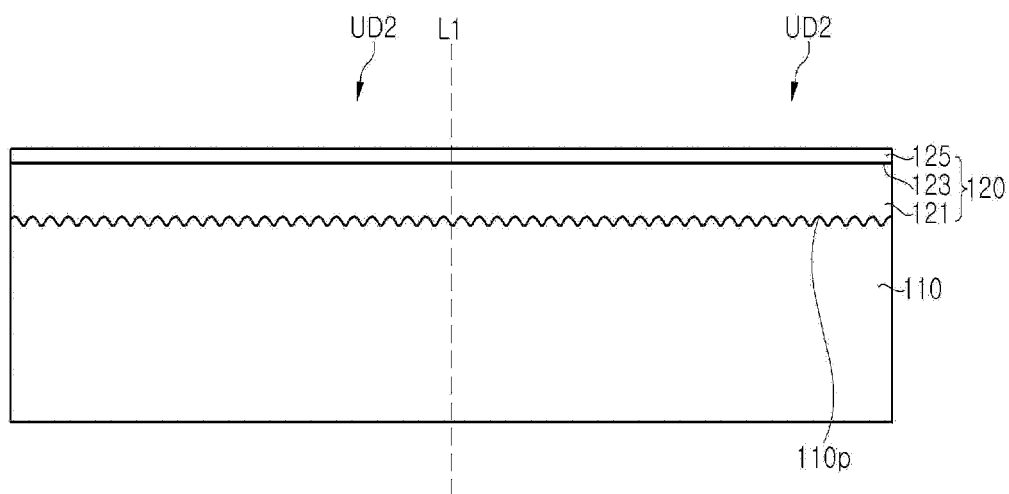

Referring to FIG. 18A and FIG. 18B, a light emitting structure 120 is disposed on a substrate 110. The light emitting structure 120 may be formed by various methods known in the art, for example, metal organic chemical vapor deposition (MOCVD), molecular beam epitaxy (MBE) or hydride vapor phase epitaxy (HVPE).

Next, referring to FIG. 19A, FIG. 19B, FIG. 20A, and FIG. 20B, mesas 120*m* including grooves 120*g* and a contact electrode 130 are formed. In addition, the light emitting structure 120 is partially removed to form an isolation trench 120*i* that exposes an upper surface of the substrate 110.

Figure 19A:
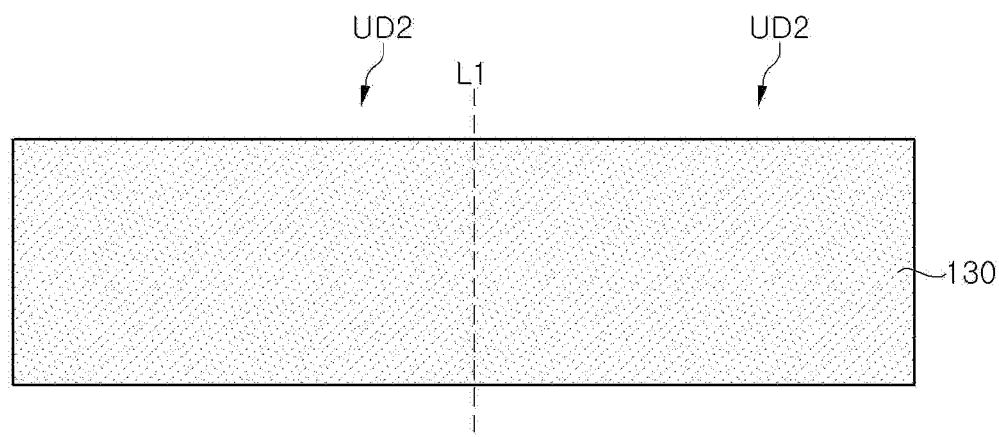
Figure 19B:
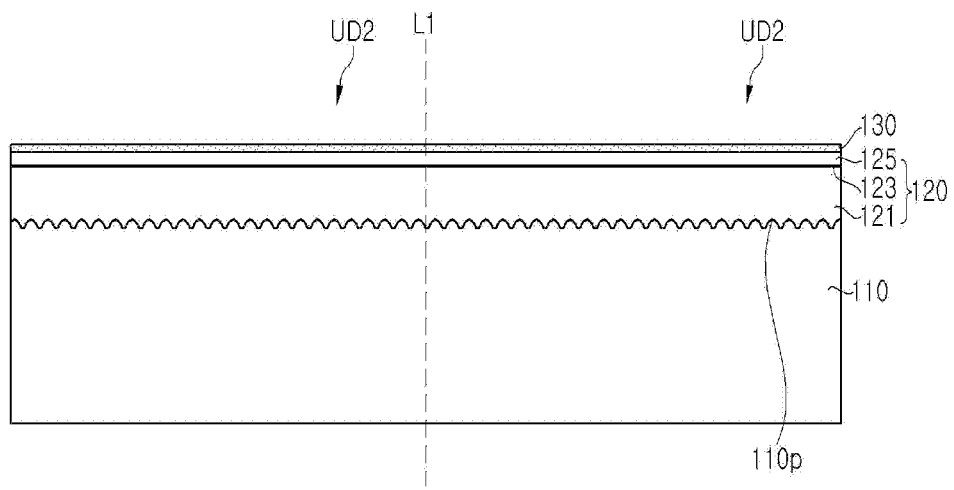

Specifically, referring to FIG. 19A and FIG. 19B, the contact electrode 130 is disposed on the light emitting structure 120.

The contact electrode 130 is disposed on a second conductive type semiconductor layer 125 of the light emitting structure 120 and may be in ohmic contact with the second conductive type semiconductor layer 125. The contact electrode 130 may include an optically transparent conductive oxide and/or an optically transparent metal. For example, formation of the contact electrode 130 may include depositing indium tin oxide (ITO) on the second conductive type semiconductor layer 125 through sputtering and/or e-beam evaporation. However, it should be understood that other implementations are also possible. Alternatively, the contact electrode 130 may include various kinds of optically transparent conductive oxides such as ZnO and may be formed by various processes depending upon the kind of conductive oxide.

Figure 20A:
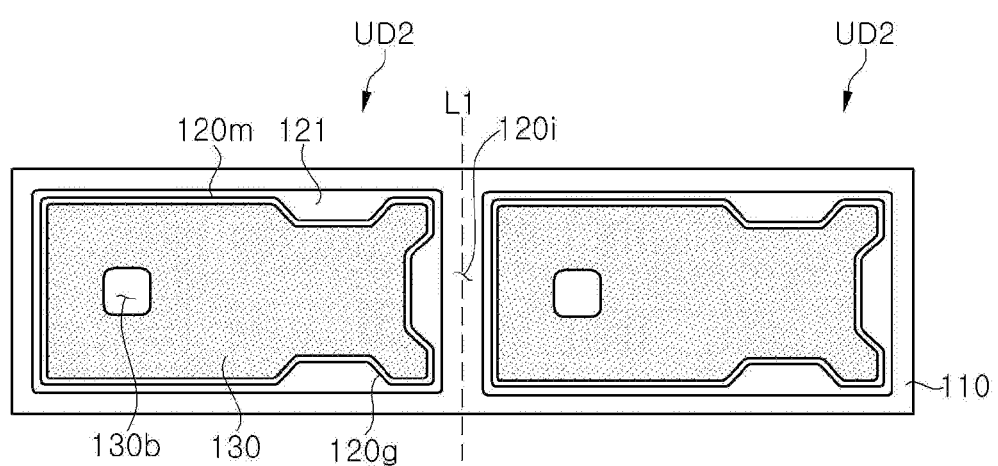
Figure 20B:
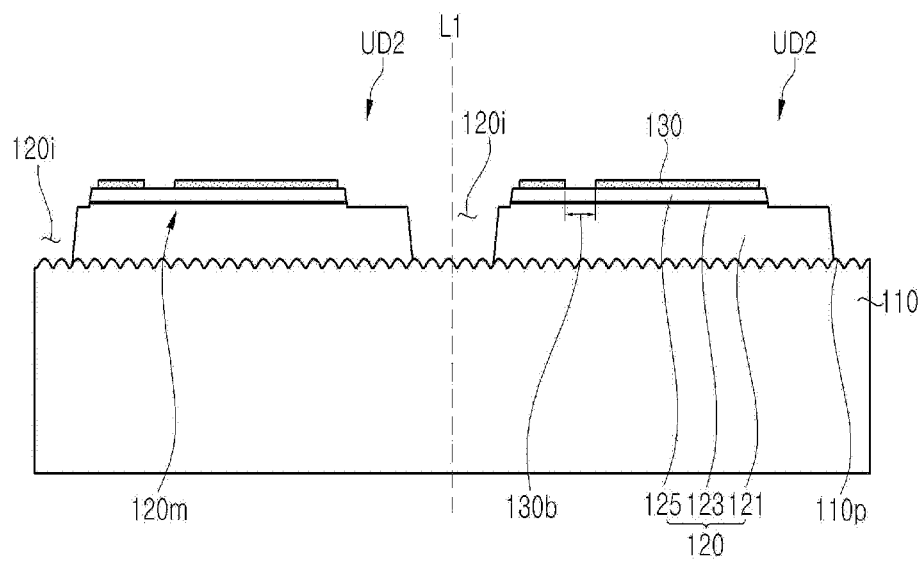

Next, referring to FIG. 20A and FIG. 20B, the mesas 120*m* each including the second conductive type semiconductor layer 125 and the active layer 123 are disposed so as to include a plurality of grooves 120*g* disposed on side surfaces thereof by patterning the light emitting structure 120. In addition, an isolation trench 120*i* is formed so as to expose the upper surface of the substrate 110 through the second conductive type semiconductor layer 125, the active layer 123 and the first conductive type semiconductor layer 121 by patterning the light emitting structure 120. Patterning of the light emitting structure 120 may be performed by, for example, dry etching and/or wet etching.

By the isolation trench 120*i*, the light emitting structure 120 is divided into a plurality of light emitting structures 120 respectively disposed on a plurality of unit diode regions UD2. Accordingly, the isolation trench 120*i* may be disposed along line L1. In this way, the light emitting structure 120 is divided into the plurality of light emitting structures 120 respectively disposed on the plurality of unit diode regions UD2 by forming the isolation trench 120*i*, thereby relieving stress caused by difference in coefficient of thermal expansion between the substrate 110 and the light emitting structure 120. As a result, it is possible to suppress wafer bowing during fabrication of the light emitting diode chips 101.

The contact electrode 130 may be subjected to patterning and patterning of the contact electrode 130 may include forming openings 130*b* that partially expose an upper surface of the second conductive type semiconductor layer 125. Patterning of the contact electrode 130 may be performed by dry etching and/or wet etching.

Although the contact electrode 130 is illustrated as being formed prior to patterning of the light emitting structure 120 in the above exemplary embodiment, it should be understood that other implementations are also possible. In various exemplary embodiments, the contact electrode 130 may be disposed on the second conductive type semiconductor layer 125 after patterning the light emitting structure 120.

Figure 21A:
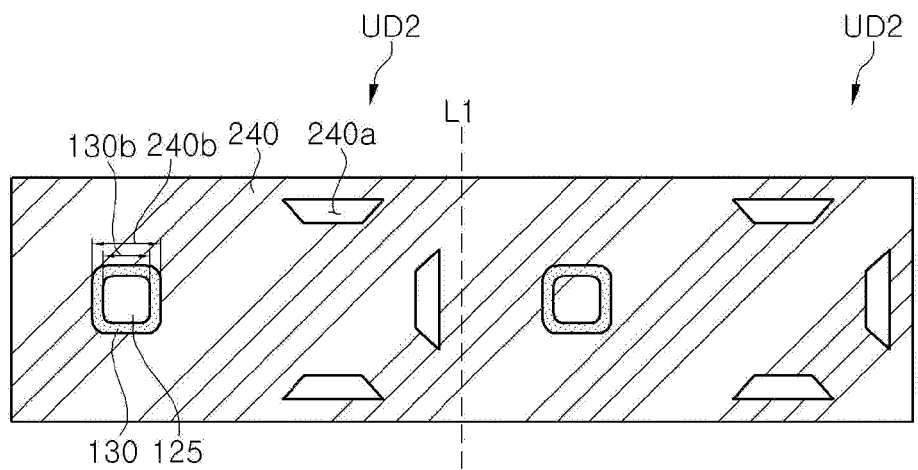
Figure 21B:
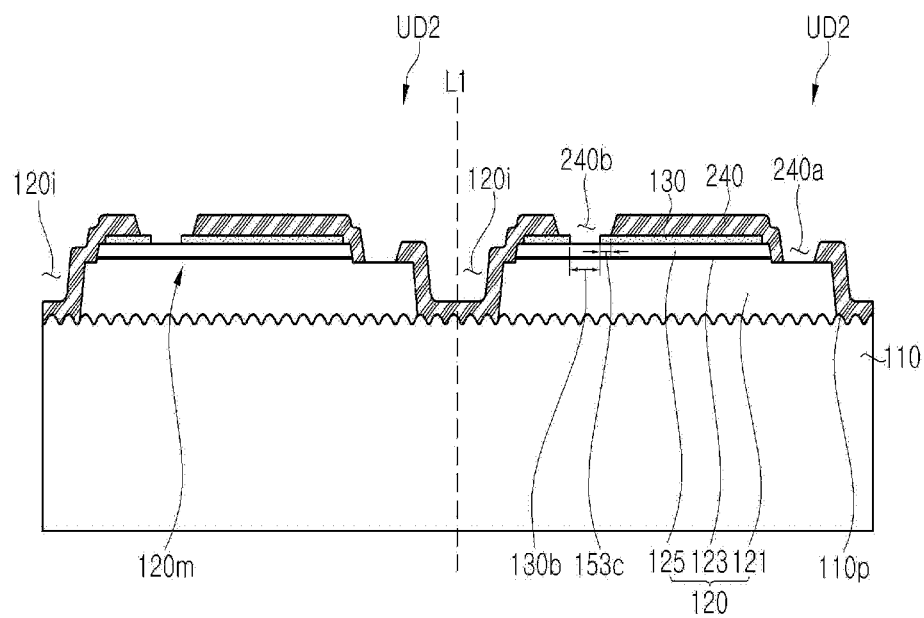

Next, referring to FIG. 21A and FIG. 21B, an insulation layer 240 including first openings 240*a* and second openings 240*b* is disposed so as to cover upper and side surfaces of the light emitting structure.

Formation of the insulation layer 240 may include forming a SiO$_2$ layer through a typical deposition method known to those skilled in the art, followed by patterning the SiO$_2$ layer. Patterning may be performed by an etching or lift-off process. In this exemplary embodiment, the insulation layer 240 may be disposed to cover the upper surface of the substrate 110 exposed through the isolation trench 120*i*.

In addition, formation of the insulation layer 240 may include forming a distributed Bragg reflector in which material layers having different indices of refraction are alternately stacked one above another. For example, formation of the insulation layer 240 may include alternately stacking a SiO$_2$ layer and a TiO$_2$ layer using a well-known method such as sputtering.

Figure 22A:
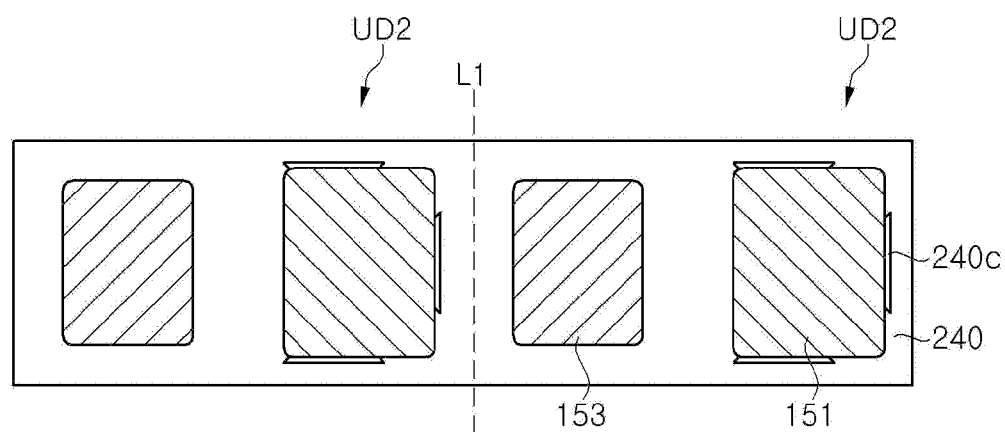
Figure 22B:
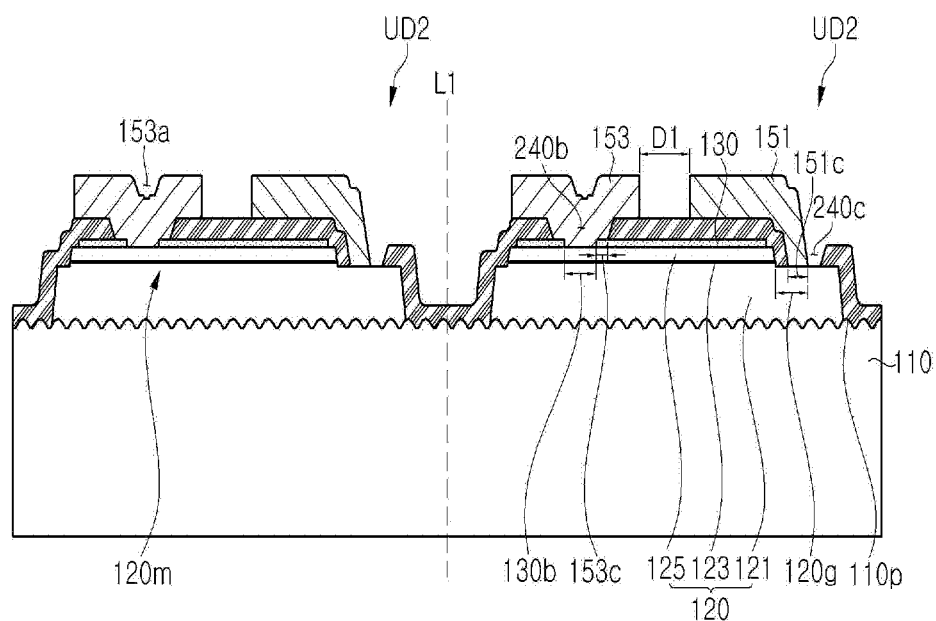

Next, referring to FIG. 22A and FIG. 22B, a first pad electrode 151 and a second pad electrode 153 may be disposed on the insulation layer 240.

The first pad electrode 151 may be in ohmic contact with the first conductive type semiconductor layer 121 through the first openings 240*a* of the insulation layer 240. Likewise, the second pad electrode 153 may contact and be electrically connected to the contact electrode 130 through the second openings 240*b* of the insulation layer 240. The first and second pad electrodes 151, 153 may be formed by the same processes, for example, through deposition and/or plating, followed by patterning through photolithography/etching technology or lift-off technology.

Figure 23A:
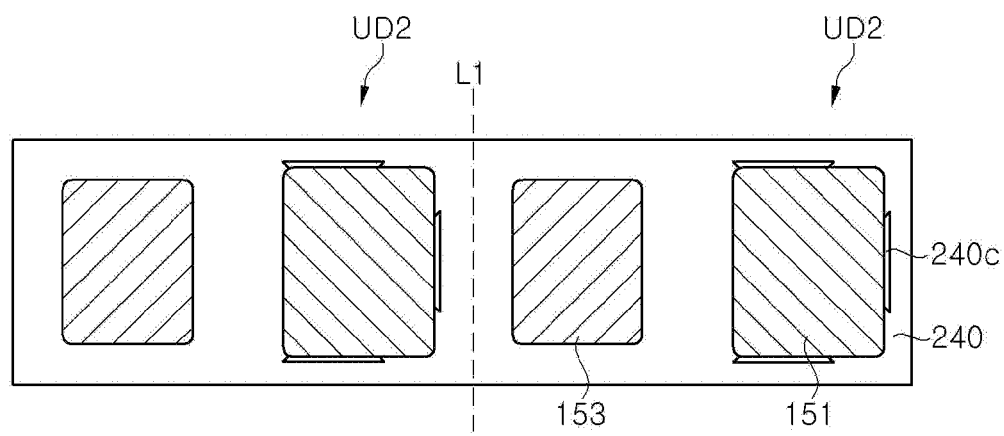
Figure 23B:
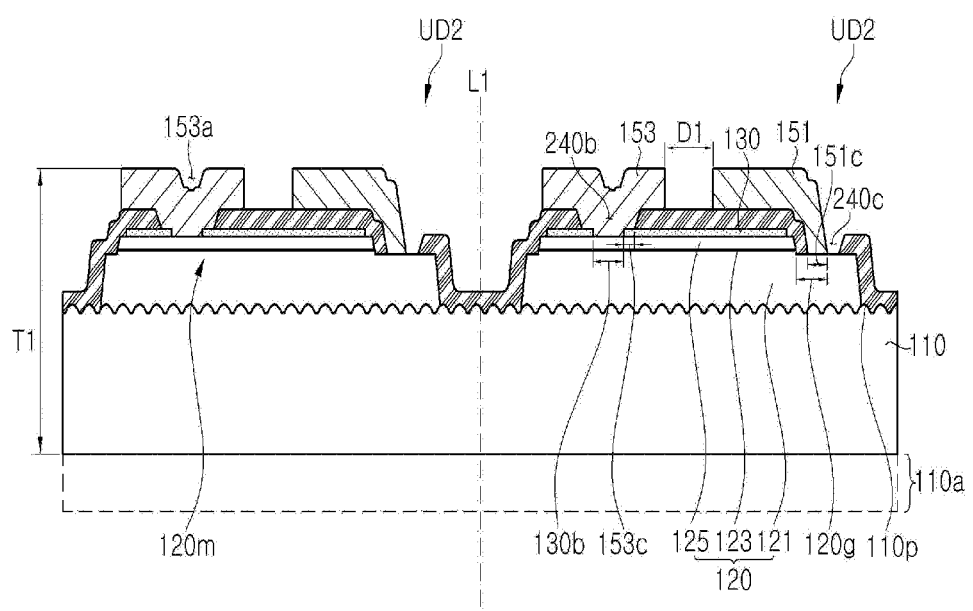

Next, referring to FIG. 23A and FIG. 23B, a portion 110*a* of the substrate 110 may be removed so as to reduce the thickness of the substrate 110. As a result, the thickness of each of the unit diode regions UD2 may be reduced by T1. Then, the substrate 110 may be divided along line L1, thereby providing a plurality of light emitting diode chips 101 as shown in FIG. 11 to FIG. 16.

Removal of the portion 110*a* of the substrate 110 may include partially removing the substrate 110 through physical and/or chemical methods. For example, the substrate 110 may be partially removed by lapping, grinding, and the like. Reduction in thickness of the substrate 110 can cause increase in stress while the substrate 110 supports a wafer in a bowed state due to difference in coefficient of thermal expansion. As a result, stress applied to the light emitting structure 120 increases, thereby causing a high probability of damage to the light emitting structure 120. However, according to this exemplary embodiment, the isolation trench 120i dividing the light emitting structure 120 into the plurality of light emitting structure 120 is formed before decreasing the thickness of the substrate 110, thereby preventing damage to the light emitting structure 120 caused by reduction in thickness of the substrate 110 by relieving wafer bowing and stress. Particularly, since stress can be further relieved due to the relatively small unit diode regions UD2, the thickness of each of the unit diode regions UD2 can be reduced to about 90 μm or less.

Division of the substrate 110 along line L1 may include dividing the substrate 110 through scribing and breaking. In some exemplary embodiments, scribing may include internal machining of the substrate 110 using an internal machining laser. With the internal machining laser, at least one modification region 111 having a band shape extending in the horizontal direction may be disposed on at least one side surface of the substrate 110. In this exemplary embodiment, the modification region 111 may be separated from the upper surface of the substrate 110 by a depth of 30 μm to 35 μm. Since such a modification region 111 is disposed below the isolation trench 120i, there is no probability of damage to the light emitting structure 120 during internal machining. Accordingly, the modification region 111 can be disposed relatively near the upper surface of the substrate 110 and thus the separation distance between the modification region 111 and the substrate 110 may be in the above range. In this way, the modification region 111 can be disposed relatively near the upper surface of the substrate 110, thereby realizing a slimmer light emitting diode chip 101.

In the light emitting diode chip 101 and the light emitting device according to the above exemplary embodiments, the upper surface of the substrate 110 includes an exposed portion, thereby suppressing wafer bowing during fabrication of the light emitting diode chip 101. As a result, since the degree of wafer bowing is relatively small, the thickness of the substrate 110 can be reduced while improving production yield of the light emitting diode chip 101, as described above. Thus, the light emitting diode chip 101 and the light emitting device have a compact and slim structure and high reliability. Further, since the insulation layer 240 extends to cover the side surface of the light emitting structure 120 and the exposed portion of the upper surface of the substrate 110, particularly, the protrusions 110p of the substrate 110, the light emitting diode chip 101 can have further improved luminous efficacy. Furthermore, with such a structure of the insulation layer 240, the bonding portions 211, 213 can cover the side surface of the light emitting diode chip 101, thereby achieving compactness of the light emitting device while improving mechanical stability thereof.

As such, with good properties in terms of mechanical stability and luminous efficacy and the compact and slim structure, the light emitting device according to the exemplary embodiments can be advantageously applied to portable electronic apparatuses. By way of example, the light emitting device or the light emitting diode chip 101 may be applied to a paper writing board that requires a slim thickness. In another example, the light emitting device may be applied to an input device such as a keyboard, in which the light emitting device is disposed under each key to allow light to be emitted through the keys. In such an input device, the keys are subjected to repeated external stress (for example, pressure applied for data input). In addition, a portable input device requires a slim thickness and a small size. The light emitting device according to the exemplary embodiments having such a compact and slim structure may be suitably applied to a portable input device having a slim structure while securing mechanical stability, thereby preventing failure of the light emitting device caused by operation of the keyboard (for example, pressure applied to the key).

Figure 24A:
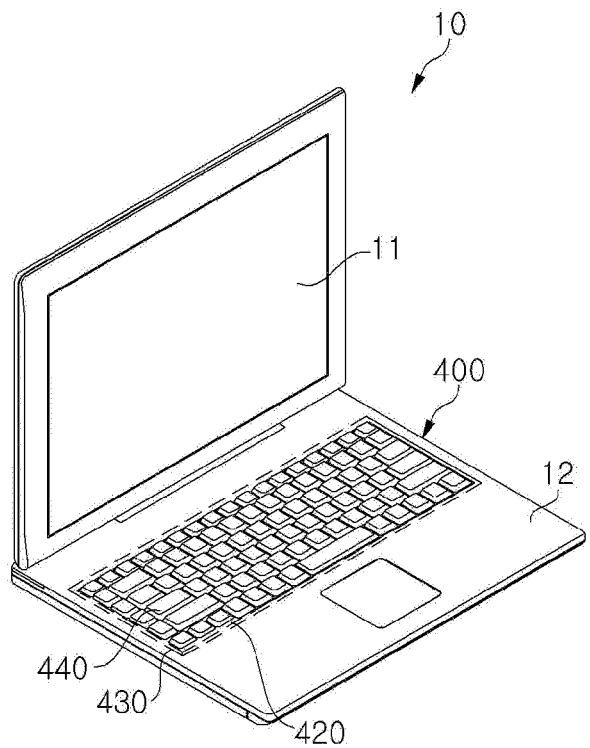
FIG. 24A, FIG. 24B, FIG. 25, and FIG. 26 are a perspective view, a plan view, a sectional view, and a circuit diagram of an electronic apparatus according to exemplary embodiments of the present disclosure.
Figure 24B:
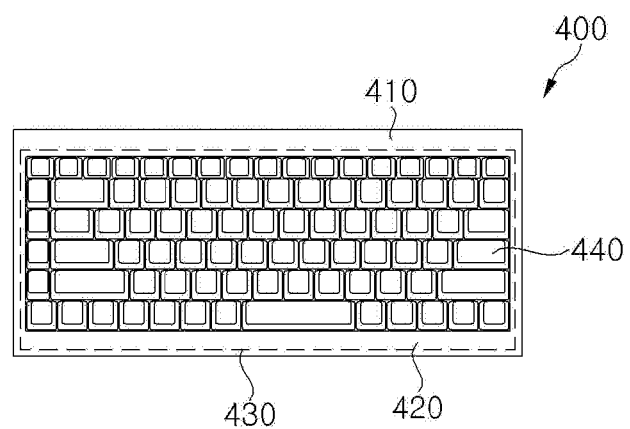
Figure 25:
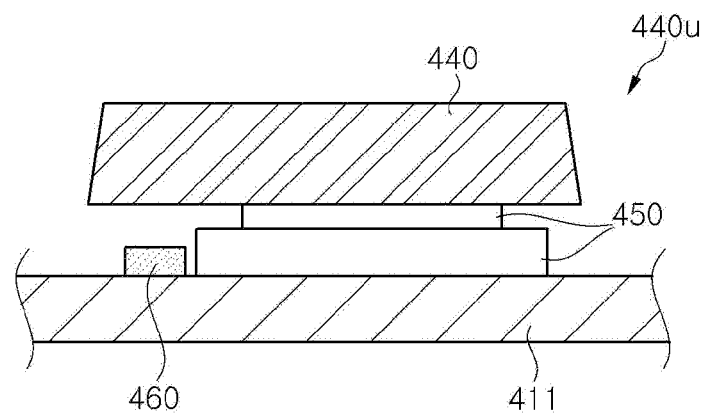
Figure 26:
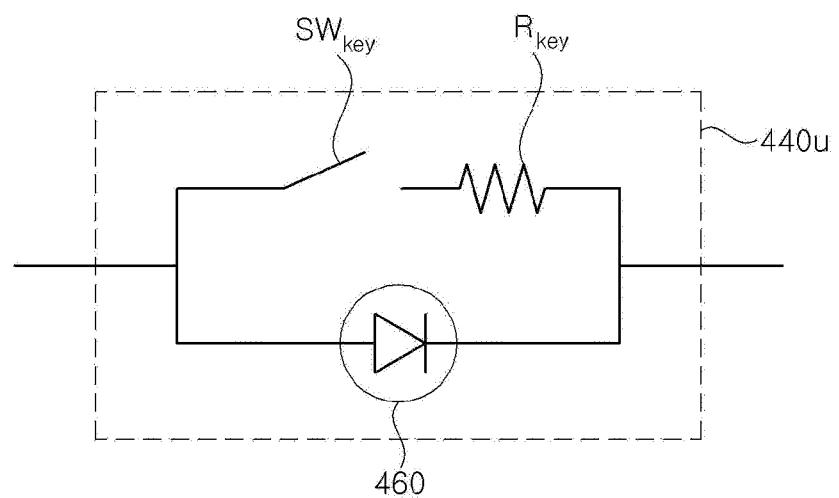

FIG. 24A to FIG. 26 are a perspective view, a plan view, a sectional view and a circuit diagram of an electronic apparatus according to other exemplary embodiments of the present disclosure. FIG. 25 is a sectional view of each of unit keys 440u of keys 440 and FIG. 26 is a circuit diagram of the unit key 440u in operation of a light emitting unit 460.

Referring to FIG. 24A, an electronic apparatus 10 includes an input device 400. For example, the electronic apparatus 10 may be a notebook computer as shown in FIG. 24A and the input device 400 may be a keyboard. The electronic apparatus 10 may include a housing 12 constituting a frame, a display 11, and the input device 400. In this exemplary embodiment, the input device 400 may be integrally formed with the electronic apparatus 10. In other exemplary embodiments, the input device 400 may be provided as a separate device. As shown in FIG. 24B, the input device 400 may individually constitute the electronic apparatus. It should be understood that the electronic apparatus 10 according to this exemplary embodiment is provided for illustration only and the light emitting diode chip and/or the light emitting device according to exemplary embodiments may be applied to any electronic apparatus so long as the electronic apparatus includes the input device 400. For example, various electronic apparatuses including the input device 400, such as desktop computers, detectors, and communication devices, fall within the scope of the present disclosure.

As shown in FIG. 24A and FIG. 24B, the input device 400 includes keys 440 and a light emitting unit 460, and may further include a housing 12 or 410, an input structure 420, and a backlight unit 430.

The housing 12 or 410 may constitute an outer frame of the input device 400 and serve to support the input structure 420, the backlight 430 and the keys 440. The input structure 420 may serve to receive and send various input signals in response to user control through the keys 440. The input structure 420 may be disposed under the keys 440 and may have various structures known in the art. The backlight 430 can illuminate the keys 440 in an upward direction in order to improve visibility of the input device 400 such as a keyboard and/or to provide additional functionality to the input device 400. The backlight 430 may include the light emitting diode chip and/or the light emitting device according to the above exemplary embodiments. The backlight 430 may be disposed to surround the key 440 or may be disposed below the keys 440. In other exemplary embodiments, the backlight 430 can be omitted.

In this exemplary embodiment, the light emitting unit 460 may be disposed under at least one key 440 among the plural keys 440. In this exemplary embodiment, the key 440 may include a luminous region disposed on a surface thereof such that light emitted from the light emitting unit 460 can be discharged through the luminous region of the key 440. Referring to FIG. 25, the key 440 is disposed above a circuit board 411 and is supported by a supporter 450. In this exemplary embodiment, the circuit board 411 and the supporter 450 may be included in the input structure 420, and when a user inputs a signal through the key 440 (for example, signal input through pressure or touch), the signal can be input through the supporter 450 and the circuit board 411. The light emitting unit 460 is disposed on the circuit board 411 to be positioned below the key 440. ON/OFF of the light emitting unit 460 may be controlled in response to an input signal through the key 440. For example, as shown in FIG. 26, a switch can be turned on or off in response to an input signal through the key 440 such that a resistor $R_{key}$ of a circuit is connected or disconnected in order to control electric current applied to the light emitting unit 460. When a user inputs a signal to the input structure by pressing the keys 440 through such operation, the light emitting unit 460 is turned on to emit light such that the light can be discharged through the luminous regions of the corresponding keys 440. However, it should be understood that other implementations are also possible. In other exemplary embodiments, the light emitting unit 460 may be maintained in an ON state and may be turned off in response to a user signal input through the keys 440 by pressing the keys 440 such that the luminous regions of the keys 440 become dark regions. In other exemplary embodiments, when a user inputs a signal to the input structure by pressing the keys 440, the light emitting units 460 are operated to emit light having variable intensity, the intensity of the luminous regions of the corresponding keys 440 varies.

The light emitting unit 460 disposed below such a key 440 may include the light emitting diode chip and/or the light emitting device according to the above exemplary embodiments. For slimness and compactness of electronic devices, the input device 400 is required to have a very slim thickness and thus a compact light emitting diode chip and/or a compact light emitting device can be applied thereto. Particularly, the compact light emitting diode chip and/or the compact light emitting device according to the exemplary embodiments of the present disclosure are applied to an input device such as a portable keyboard or to an input device of an electronic apparatus such as a lightweight notebook computer in order to prevent increase in volume of the electronic apparatus due to increase in size of the light emitting unit 460, thereby improving portability of the electronic apparatus. In addition, the light emitting unit 460 disposed below each of the keys 440 is subjected to continuous stress upon continuous operation of the key 440, and such stress is transferred to the light emitting device or the light emitting diode chip 101 of the light emitting unit 460, thereby causing failure of the light emitting unit 460. However, the input device 400 includes the light emitting diode chip 101 or the light emitting device according to the exemplary embodiments, thereby preventing failure of the light emitting unit 460 caused by continuous operation of the key 440.

In the above exemplary embodiments, the light emitting diode chips and/or light emitting devices according to various exemplary embodiments of the present disclosure are applied to the input device of the electronic apparatus. However, it should be understood that other implementations are also possible. The light emitting diode chip and/or light emitting device may also be applied to various electronic apparatuses, for example, a lighting apparatus, a display device, and the like, which require a compact light emitting unit.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A light emitting diode chip comprising:
a substrate comprising protrusions disposed on an upper surface thereof;
a light emitting structure disposed on the substrate and comprising a first conductive type semiconductor layer, a second conductive type semiconductor layer disposed on the first conductive type semiconductor layer, and an active layer disposed between the first and second conductive type semiconductor layers, the light emitting structure comprising at least one hole through the second conductive type semiconductor layer and the active layer and exposing a portion of the first conductive type semiconductor layer;
a contact electrode disposed on at least part of the second conductive type semiconductor layer, in ohmic contact with the second conductive type semiconductor layer, and comprising an optically transparent conductive oxide;
a light reflective insulation layer covering a side surface and an upper surface of the light emitting structure, and comprising a first opening exposing the first conductive type semiconductor layer exposed through the at least one hole and a second opening partially exposing the contact electrode, the light reflective insulation layer comprising a distributed Bragg reflector;
a first pad electrode disposed on the light reflective insulation layer and electrically connected to the first conductive type semiconductor layer through the first opening; and
a second pad electrode disposed on the light reflective insulation layer and electrically connected to the contact electrode through the second opening,
wherein a portion of an upper surface of the substrate is exposed around the light emitting structure, the light reflective insulation layer adjoins the upper surface of the substrate exposed through the light emitting structure, and an upper edge of the substrate is spaced apart from the light reflective insulation layer.

2. The light emitting diode chip according to claim 1, wherein the light emitting diode chip has a thickness in a range from 40 µm to 90 µm.

3. The light emitting diode chip according to claim 1, wherein the light emitting diode chip has a horizontal cross-sectional area in a range from 30,000 µm$^2$ to 65,000 µm$^2$.

4. The light emitting diode chip according to claim 1, wherein drive current for operation of the light emitting diode chip is configured to have a current density in range from 7 mA/mm$^2$ to 250 mA/mm$^2$.

5. The light emitting diode chip according to claim 1, wherein a total area of the first pad electrode and the second pad electrode ranges from 80% to 95% of a horizontal cross-sectional area of the light emitting diode chip.

6. The light emitting diode chip according to claim 5, wherein a shortest distance between the first pad electrode and the second pad electrode is in a range from 3 µm to 20 µm.

7. The light emitting diode chip according to claim 1, wherein some of the protrusions disposed on the upper surface of the substrate are covered by the light reflective insulation layer.

8. The light emitting diode chip according to claim 7, wherein others of the protrusions disposed on the upper surface of the substrate are exposed.

9. The light emitting diode chip according to claim 1, wherein the contact electrode covers an upper surface of the second conductive type semiconductor layer, and comprises a third opening exposing the at least one hole of the light emitting structure and at least one fourth opening partially exposing the second conductive type semiconductor layer.

10. The light emitting diode chip according to claim 9, wherein the fourth opening has a smaller width than the second opening and an upper surface of the contact electrode partially adjoins the second pad electrode.

11. The light emitting diode chip according to claim 1, wherein the substrate comprises a patterned sapphire substrate.

12. The light emitting diode chip according to claim 1, wherein the first pad electrode comprises a depression disposed in an upper surface thereof and positioned at a location corresponding to the first opening, and the second pad electrode comprises a depression disposed in an upper surface thereof and positioned at a location corresponding to the second opening.

13. A light emitting device comprising the light emitting chip according to claim 1, further comprising:
a second substrate;
the light emitting diode chip disposed on the second substrate; and
the substrate of the light emitting diode chip comprising a first bonding portion and a second bonding portion disposed between the light emitting diode chip and the second substrate,
wherein the first and second bonding portions are electrically connected to the first and second pad electrodes, respectively.

14. The light emitting device according to claim 13, wherein a shortest distance between the first and second bonding portions is greater than a shortest distance between the first and second pad electrodes.

15. The light emitting device according to claim 13, wherein at least one of the first and second bonding portions at least partially covers the light reflective insulation layer covering the side surface of the light emitting structure.

16. The light emitting device according to claim 14, wherein at least one of the first and second bonding portions at least partially covers a lower surface of the substrate of the light emitting diode chip exposed around the light emitting structure.

17. The light emitting device according to claim 15, wherein at least one of the first and second bonding portions at least partially covers a side surface of the substrate of the light emitting diode chip.

18. The light emitting device according to claim 13, wherein the first and second bonding portions comprise solder.

19. A light emitting diode chip comprising:
a substrate comprising protrusions disposed on an upper surface thereof and having a partially exposed portion on the upper surface thereof;
a light emitting structure disposed on the substrate, and comprising a first conductive type semiconductor layer, a second conductive type semiconductor layer disposed on the first conductive type semiconductor layer, and an active layer disposed between the first and second conductive type semiconductor layers, the light emitting structure comprising a mesa comprising the active layer and the second conductive type semiconductor layer;
a contact electrode disposed on the mesa and comprising an optically transparent conductive oxide;
an insulation layer covering a side surface and an upper surface of the light emitting structure and the upper surface of the substrate, and comprising a first opening partially exposing the first conductive type semiconductor layer and a second opening partially exposing the contact electrode; and
a first pad electrode and a second pad electrode disposed on the insulation layer,
wherein the mesa comprises a first portion and a second portion, the first portion comprising grooves disposed on side surfaces of the mesa, the grooves being disposed on at least three side surfaces of the first portion,
the first opening exposes at least part of the first conductive type semiconductor layer exposed through the grooves,
the first pad electrode is disposed on the first portion and covers at least part of side surfaces of the grooves in ohmic contact with the first conductive type semiconductor layer through the first opening, and
the second pad electrode is disposed on the second portion and is electrically connected to the contact electrode through the second opening.

20. The light emitting diode chip according to claim 19, further comprising a first contact region comprising a plurality of first contact regions in which at least part of the first conductive type semiconductor layer exposed through the grooves contact the first pad electrode; and a second contact region in which the contact electrode contacts the second pad electrode, wherein a shortest distance from a first contact region disposed farthest away from the second contact region to the second contact region is 200 μm or less.

21. The light emitting diode chip according to claim 19, wherein the mesa comprises a first side surface, a second side surface disposed opposite the first side surface, and third and fourth side surfaces disposed between the first side surface and the second side surface,
each of the first portion and the second portion of the mesa comprises a first side surface and a second side surface,
at least one of the grooves is disposed on the first side surface, and
at least some of the grooves are disposed on the third side surface and the fourth side surface.

22. The light emitting diode chip according to claim 21, wherein the grooves are arranged in symmetry with respect to an imaginary line extending from the first side surface to the second side surface.

23. The light emitting diode chip according to claim 19, wherein some side surfaces of the first opening are separated from the first pad electrode.

24. The light emitting diode chip according to claim 19, wherein at least one of the grooves is disposed closer to the second pad electrode than the side surface of the first pad electrode opposite the second pad electrode.

25. The light emitting diode chip according to claim 19, wherein the contact electrode comprises a third opening, the third opening being disposed inside the second opening.

26. The light emitting diode chip according to claim 25, wherein, in the contact electrode, a region between the third opening and a side surface of the second opening adjoins the second pad electrode.

27. The light emitting diode chip according to claim 19, wherein the substrate comprises a modification region disposed on at least part of a side surface thereof, and a distance from the modification region to the upper surface of the substrate is smaller than a distance from the modification region to a lower surface of the substrate.

28. The light emitting diode chip according to claim 27, wherein the distance from the modification region to the upper surface of the substrate is in a range from 30 μm to 35 μm.

29. The light emitting diode chip according to claim 19, wherein the light emitting diode chip has a thickness in a range from 40 μm to 90 μm.

30. The light emitting diode chip according to claim 19, wherein the light emitting diode chip has a horizontal cross-sectional area in a range from 30,000 μm² to 70,000 μm².

31. The light emitting diode chip according to claim 19, wherein drive current for operation of the light emitting diode chip is configured to have a current density in a range from 5 mA/mm² to 400 mA/mm².

32. The light emitting diode chip according to claim 19, wherein a total area of the first pad electrode and the second pad electrode is 50% to 95% of a horizontal cross-sectional area of the light emitting diode chip.

33. A light emitting device comprising the light emitting diode chip according to claim 19, comprising:
 a second substrate;
 the light emitting diode chip disposed on the second substrate; and
 a first bonding portion and a second bonding portion interposed between the light emitting diode chip and the second substrate.

34. The light emitting device according to claim 33, wherein a shortest distance between the first and second bonding portions is greater than a shortest distance between the first and second pad electrodes.

35. The light emitting device according to claim 33, wherein at least one of the first and second bonding portions at least partially covers the light reflective insulation layer covering the side surface of the light emitting structure.

36. The light emitting device according to claim 35, wherein at least one of the first and second bonding portions at least partially covers a lower surface of the substrate of the light emitting diode chip around the light emitting structure.

37. The light emitting device according to claim 36, wherein at least one of the first and second bonding portions at least partially covers a side surface of the substrate of the light emitting diode chip.

38. The light emitting device according to claim 33, wherein the first and second bonding portions comprise solder.

39. An electronic apparatus comprising the light emitting diode chip according to claim 1, and further comprising:
 an input device comprising the light emitting diode chip.

40. The electronic apparatus according to claim 39, wherein the input device comprises a keyboard having a plurality of keys, each of the keys comprising a luminous region disposed on an upper surface thereof, and
 light discharged through the luminous region is emitted from the light emitting diode chip.

41. The electronic apparatus according to claim 39, wherein the input device comprises a keyboard having a plurality of keys, each of the keys comprising a luminous region disposed on an upper surface thereof,
 the light emitting diode chip is disposed under at least some of the plurality of keys, and
 light emitted from the light emitting diode chip is discharged through the luminous region.

42. An electronic apparatus comprising the light emitting diode chip according to claim 19, and further comprising:
 an input device comprising the light emitting diode chip.

43. The electronic apparatus according to claim 42, wherein the input device comprises a keyboard having a plurality of keys, each of the keys comprising a luminous region disposed on an upper surface thereof, and
 light discharged through the luminous region is emitted from the light emitting diode chip.

44. The electronic apparatus according to claim 42, wherein the input device comprises a keyboard having a plurality of keys, each of the keys comprising a luminous region disposed on an upper surface thereof,
 the light emitting diode chip is disposed under at least some of the plurality of keys, and
 light emitted from the light emitting diode chip is discharged through the luminous region.

* * * * *